United States Patent
Liao et al.

(10) Patent No.: US 12,394,706 B2
(45) Date of Patent: Aug. 19, 2025

(54) DEVICE WITH GATE-TO-DRAIN VIA AND RELATED METHODS

(71) Applicant: Taiwan Semiconductor Manufacturing Co., Ltd., Hsinchu (TW)

(72) Inventors: Yi-Bo Liao, Hsinchu (TW); Jin Cai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 431 days.

(21) Appl. No.: 18/172,246

(22) Filed: Feb. 21, 2023

(65) Prior Publication Data

US 2024/0120273 A1 Apr. 11, 2024

Related U.S. Application Data

(60) Provisional application No. 63/413,556, filed on Oct. 5, 2022.

(51) Int. Cl.
*H01L 23/522* (2006.01)
*H10B 10/00* (2023.01)

(52) U.S. Cl.
CPC ....... *H01L 23/5226* (2013.01); *H10B 10/125* (2023.02)

(58) Field of Classification Search
CPC .......................... H01L 23/5226; H10B 10/125
USPC ......................................................... 257/393
See application file for complete search history.

(56) References Cited

U.S. PATENT DOCUMENTS

| | | | |
|---|---|---|---|
| 9,236,267 B2 | 1/2016 | De et al. | |
| 9,502,265 B1 | 11/2016 | Jiang et al. | |
| 9,520,466 B2 | 12/2016 | Holland et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 9,786,774 B2 | 10/2017 | Colinge et al. | |
| 9,853,101 B2 | 12/2017 | Peng et al. | |
| 9,881,993 B2 | 1/2018 | Ching et al. | |
| 11,935,825 B2 * | 3/2024 | Sio ..................... | H10D 84/0149 |

(Continued)

FOREIGN PATENT DOCUMENTS

| | | |
|---|---|---|
| TW | 202230806 A | 8/2022 |
| TW | 202234402 A | 9/2022 |

*Primary Examiner* — Tu-Tu V Ho
(74) *Attorney, Agent, or Firm* — Seed Intellectual Property Law Group LLP

(57) ABSTRACT

A device includes: a first stack of first semiconductor nanostructures; a second stack of second semiconductor nanostructures on the first stack of semiconductor nanostructures; a third stack of first semiconductor nanostructures adjacent the first stack; a first gate structure wrapping around the first stack and the second stack; a second gate structure wrapping around the third stack; a gate isolation structure between the first gate structure and the second gate structure; a dielectric layer on the second gate structure and laterally abutting the gate isolation structure; and a via. The via includes: a first portion that extends in a first direction, the first portion being on the first gate structure, the gate isolation structure and the dielectric layer; and a second portion that extends in a second direction transverse the first direction.

20 Claims, 34 Drawing Sheets

(56) References Cited

U.S. PATENT DOCUMENTS

2020/0365602 A1 11/2020 Yang et al.
2021/0305362 A1 9/2021 Bouche et al.
2021/0366536 A1 11/2021 Liaw
2022/0093592 A1 3/2022 Guler et al.

* cited by examiner

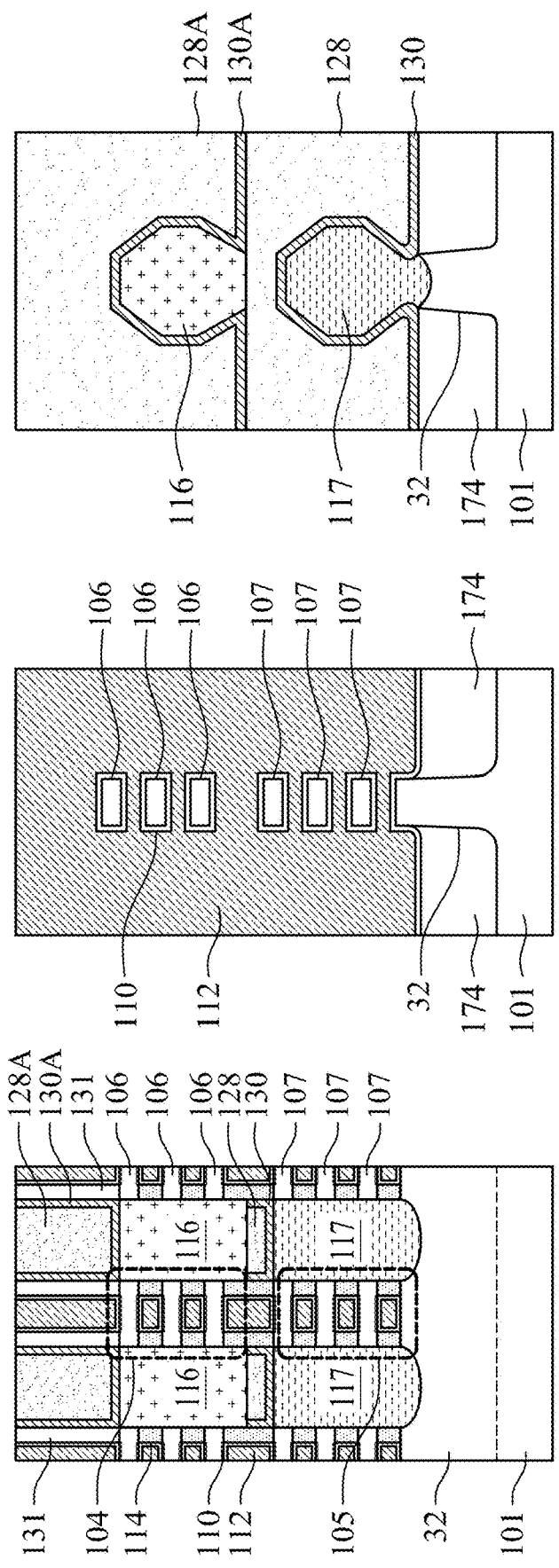

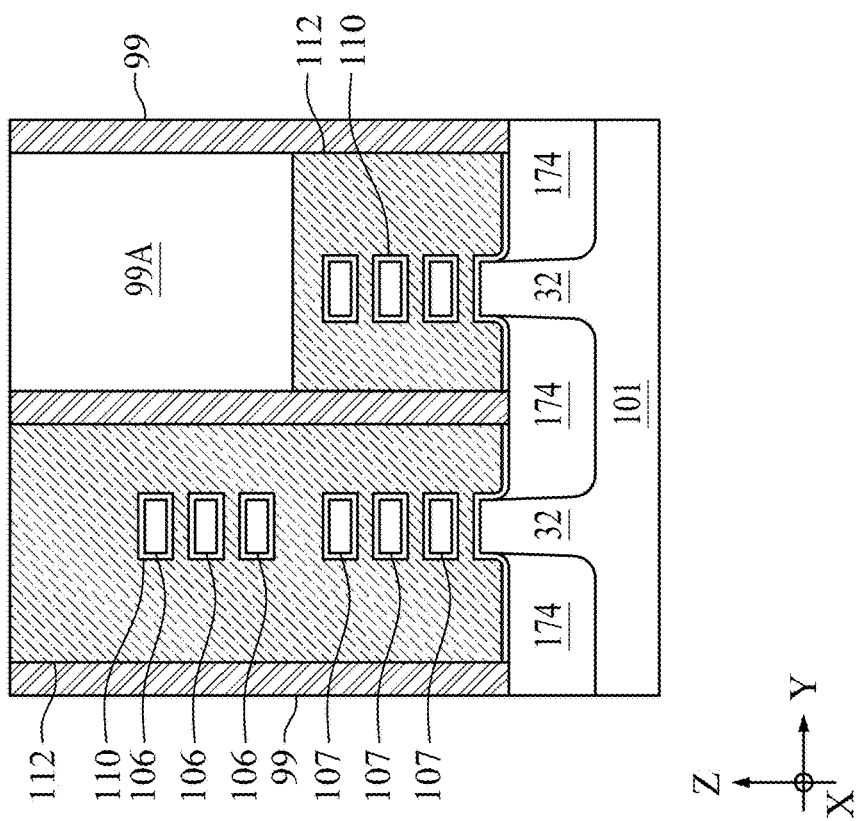
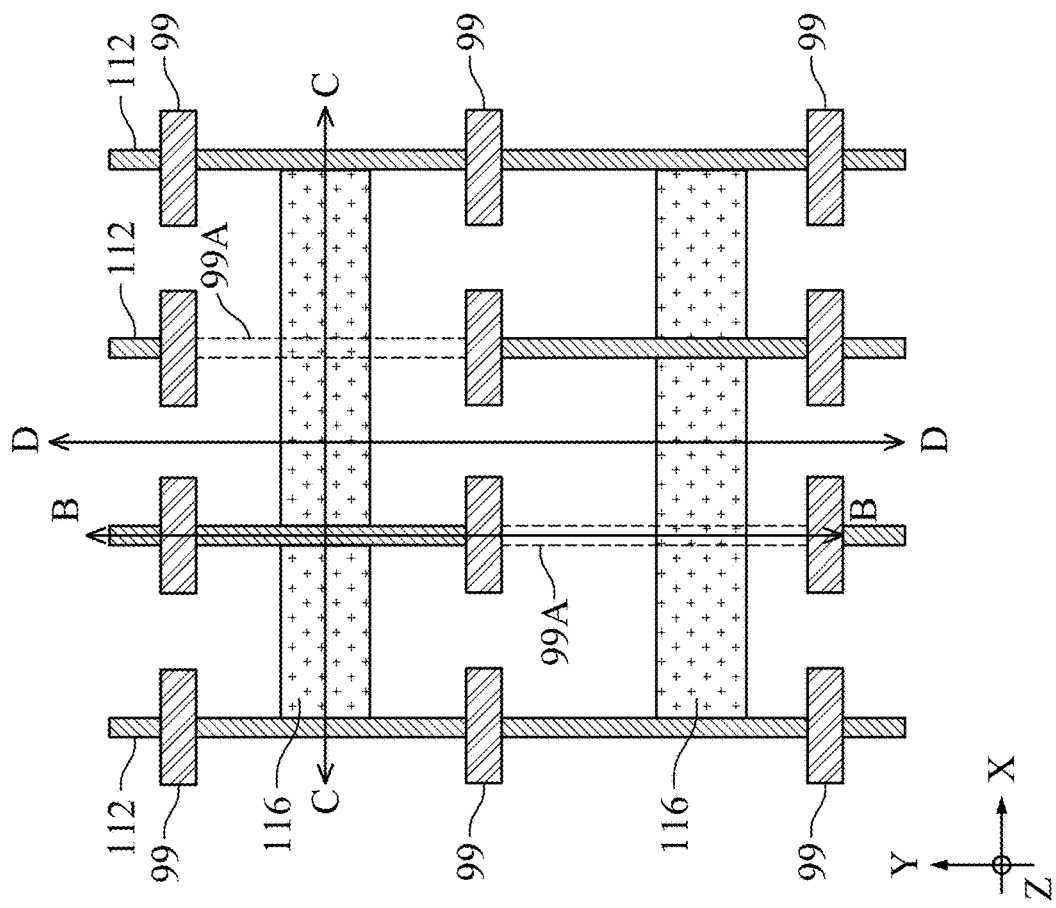
FIG. 17B
FIG. 17A

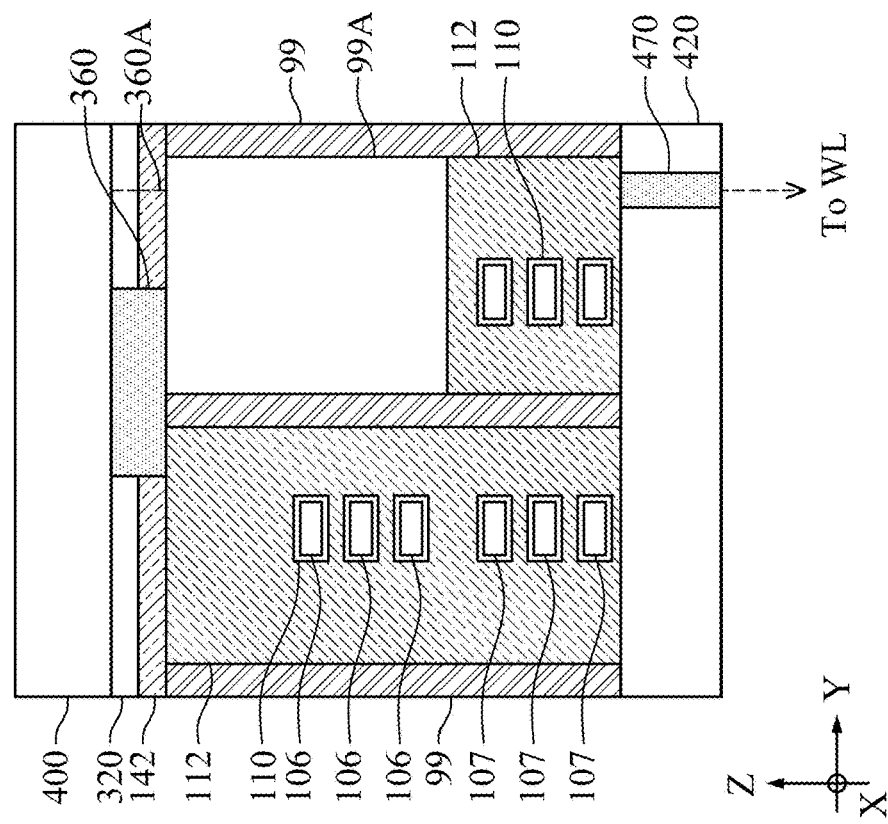
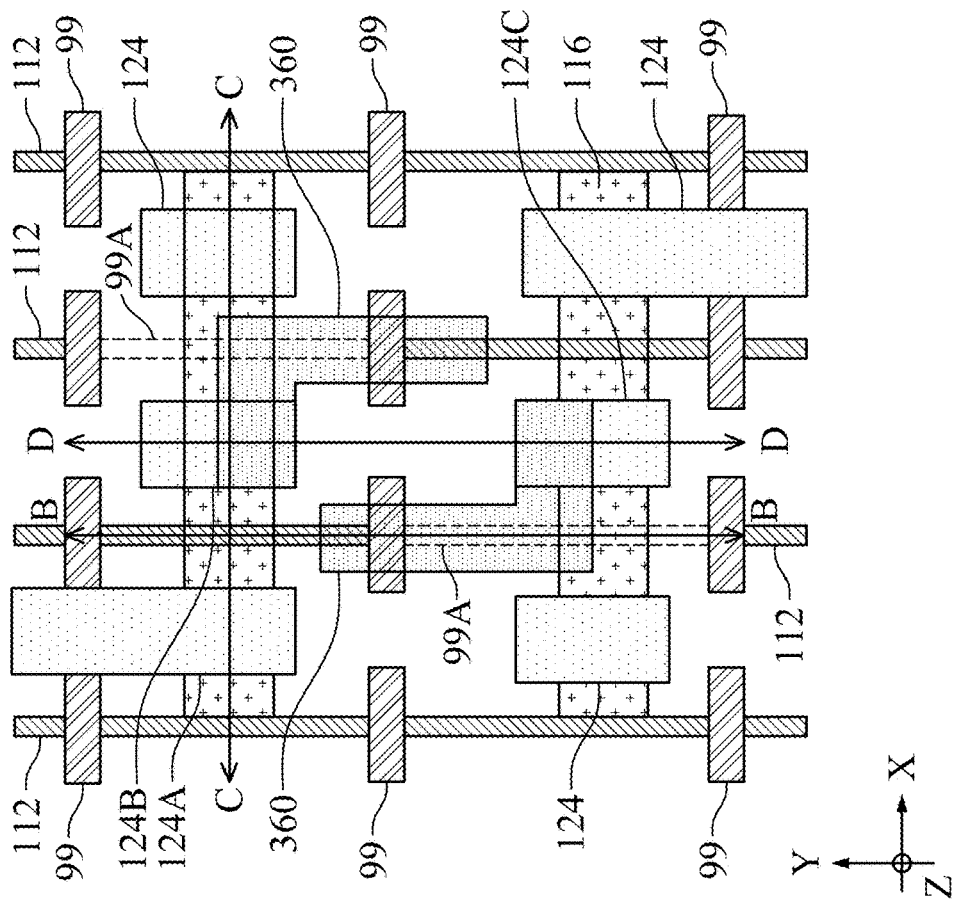
FIG. 19B
FIG. 19A

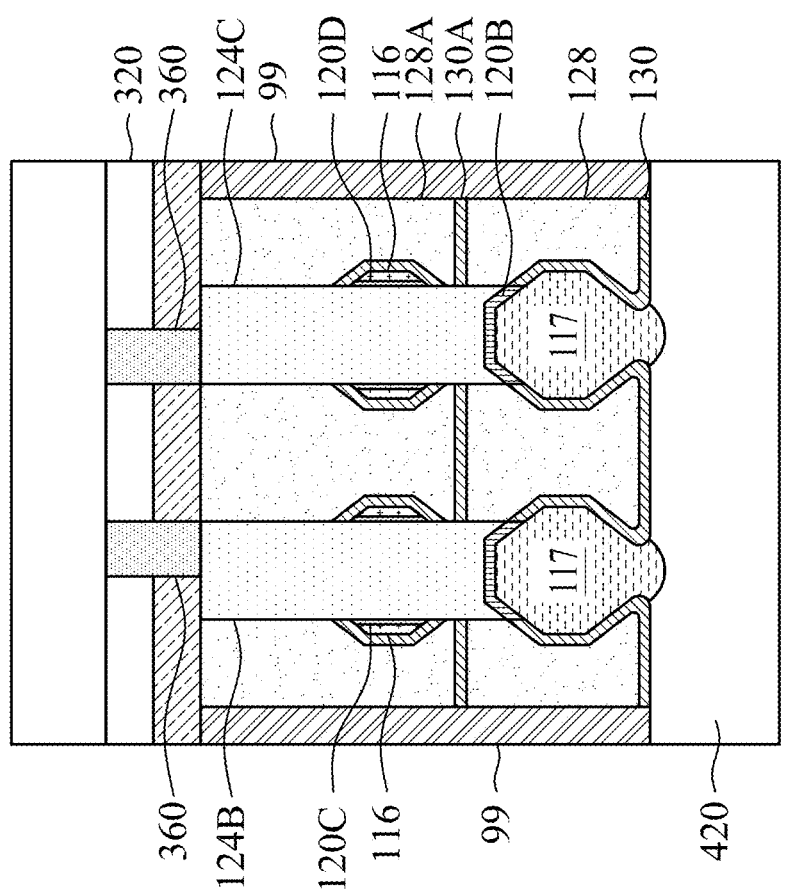
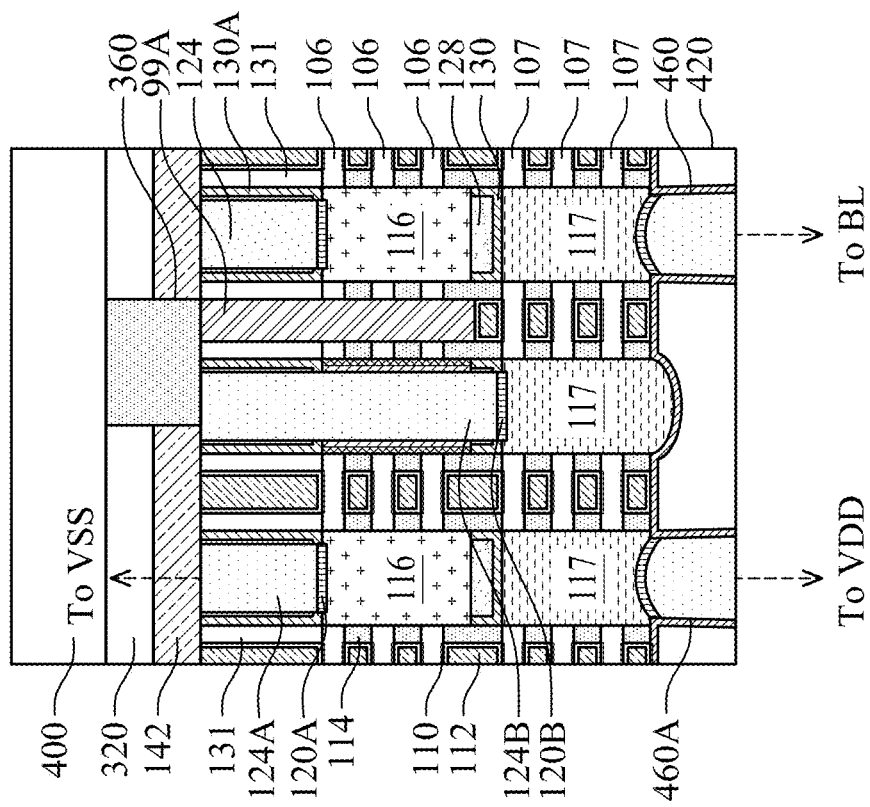
FIG. 19D
FIG. 19C

US 12,394,706 B2

DEVICE WITH GATE-TO-DRAIN VIA AND RELATED METHODS

PRIORITY CLAIM AND CROSS-REFERENCE

This application claims the benefit of priority to U.S. Provisional Application Ser. No. 63/413,556, entitled "Semiconductor structure with CFET SRAM and Method for forming the same," filed on Oct. 5, 2022, which application is incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-15D are views of an IC device at various stages of fabrication according to aspects of the present disclosure.

FIGS. 16A-19D are views of various embodiments of an IC device at various stages of forming through vias in accordance with various embodiments.

DETAILED DESCRIPTION

Figure 1:
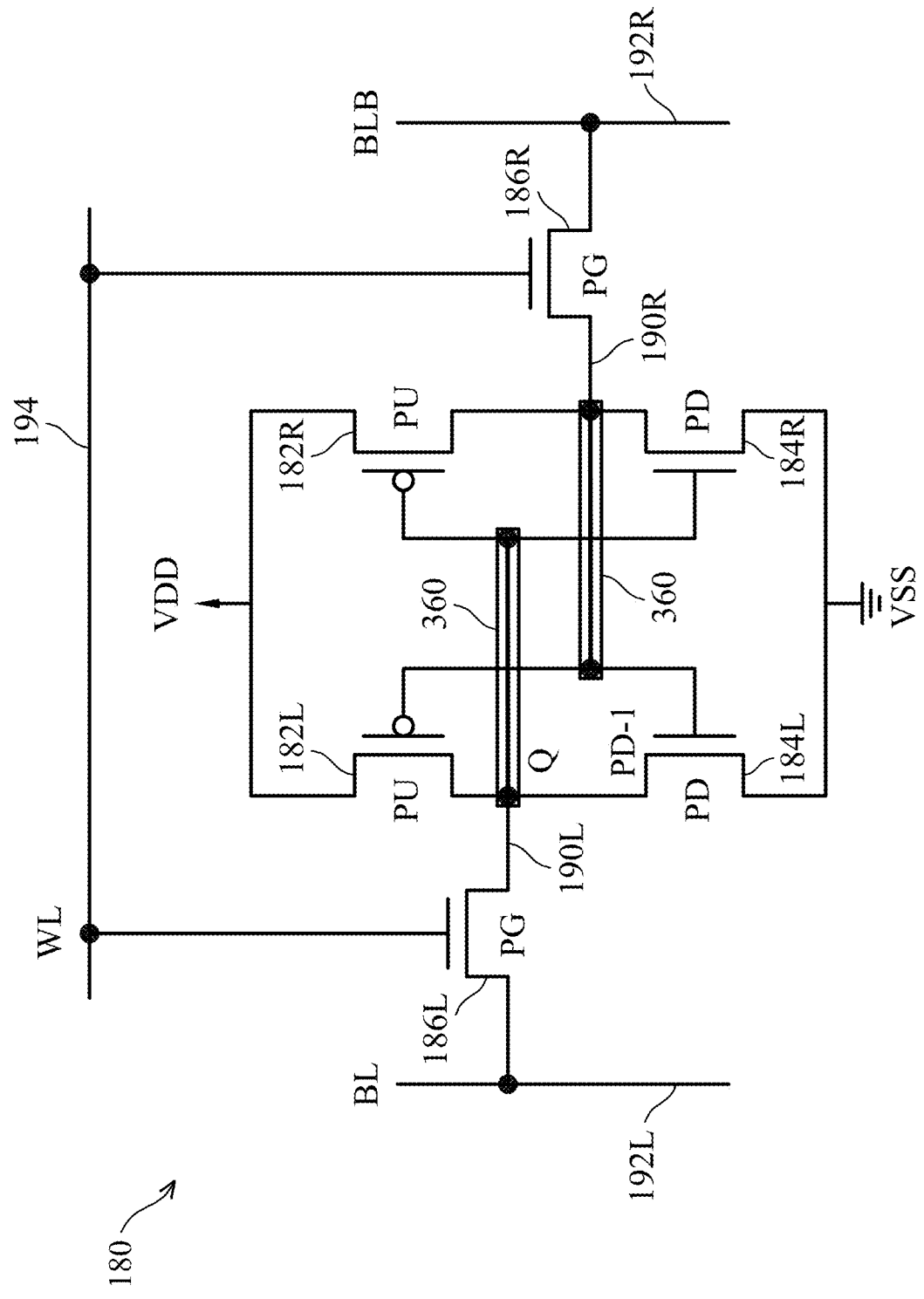
FIG. 1 is a circuit diagram of a memory circuit according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to field-effect transistors (FETs), such as planar FETs, three-dimensional fin-line FETs (FinFETs), or nanostructure devices. Examples of nanostructure devices include gate-all-around (GAA) devices, nanosheet FETs (NSFETs), nanowire FETs (NWFETs), and the like. In advanced technology nodes, with scaling down of integrated circuit (IC) devices, static random-access memory (SRAM) area reduction is increasingly difficult. Complementary (CFET) devices are a promising candidate for advanced logic and memory technology due to high transistor density, which can be achieved by stacking devices in bottom and top layers. In a CFET SRAM, gate-to-drain connections use a large extension due to gate and drain being connected by a lateral via.

Embodiments disclosed herein include an L-shaped middle via for gate-to-drain connection, which reduces SRAM area. Removal of a sacrificial gate and nanostructure channels is followed by formation of a dielectric replacement layer, which is advantageous for disposing the L-shaped middle via to reduce SRAM area. Inclusion of the L-shaped middle via for gate-to-drain connection relaxes gate isolation (CMG) overlay window and source/drain isolation (CMD) overlay window, which is advantageous for reducing SRAM area. The L-shaped middle via may be disposed at a frontside of the IC device or at a backside of the IC device, which increases design flexibility, and may simplify frontside routing when the L-shaped middle via is disposed at the backside.

FIG. 1 is a circuit schematic diagram that illustrates a six-transistor (6T) SRAM memory circuit or memory cell 180 in accordance with various embodiments. A 6T cell is described for simplicity of illustration, however it should be appreciated that the L-shaped middle via of the disclosure may be included in other memory cells, such as a 7T or 8T memory cell. An IC device may include the memory circuit 180, which may be one of an arrangement of millions, billions or trillions of similar memory circuits.

The memory circuit 180 includes two pull-up transistors 182L, 182R, which are respectively operable to pull up voltages at nodes 190L, 190R to a first voltage level VDD, which may be a high voltage in some embodiments. The pull-up transistors 182L, 182R may be p-type field-effect transistors (PFETs), as shown. In some embodiments, the pull-up transistors 182L, 182R are n-type field-effect transistors (NFETs). Each of the pull-up transistors 182L, 182R has a source electrode coupled to a first supply node, a drain electrode coupled to the respective node 190L, 190R and a gate electrode coupled to the other of the nodes 190L, 190R, as shown.

The memory circuit 180 includes two pull-down transistors 184L, 184R, which are respectively operable to pull down voltages at the nodes 190L, 190R to a second voltage level VSS, which may be a low voltage or ground in some embodiments. The pull-down transistors 184L, 184R may be NFETs, as shown, or may be PFETs. Each of the pull-down transistors 184L, 184R has a source electrode coupled to a second supply node, a drain electrode coupled to the respective node 190L, 190R and a gate electrode coupled to the other of the nodes 190L, 190R, as shown.

The memory circuit 180 includes two pass gate transistors 186L, 186R, which are respectively operable to establish or cut off electrical communication between the nodes 190L, 190R and respective bit lines 192L, 192R. The pass gate transistors 186L, 186R may be NFETs, as shown, or PFETs. Each of the pass gate transistors 186L, 186R has a first source/drain electrode coupled to the respective bit line 192L, 192R, a second source/drain electrode coupled to the respective node 190L, 190R and a gate electrode coupled to a word line 194. The bit line 192L carries a first bit line signal BL, the bit line 192R carries a second bit line signal BLB, and the word line 194 carries a word line signal WL.

The memory circuit 180 includes two gate-to-drain vias 360, which are each connected to a respective pair of drain electrodes and a respective pair of gate electrodes of the transistors 182L, 184L or the transistors 182R, 184R. For example, one of the gate-to-drain vias 360 is connected to the gate electrode of the pull-up transistor 182L and the drain electrode of the pull-up transistor 182R. For example, the other of the gate-to-drain vias 360 is connected to the gate electrode of the pull-up transistor 182R and the drain electrode of the pull-up transistor 182L. The gate-to-drain vias 360 are L-shaped, and may be referred to as "L-shaped middle vias 360," which will be described in greater detail with reference to FIGS. 15A-22C. The L-shaped middle vias 360 allow for relaxing of gate and source/drain isolation overlay, which enables reduction in layout area of the memory circuit 180.

FIGS. 2A-15D illustrate formation of an IC device including one or more CFETs in accordance with various embodiments. In some embodiments, the method 1000 for forming the semiconductor structure includes a number of operations (1100, 1200, 1300, 1400, 1500, 1600 and 1700). The method 1000 for forming the semiconductor structure will be further described according to one or more embodiments. It should be noted that the operations of the method 1000 may be rearranged or otherwise modified within the scope of the various aspects. It should further be noted that additional processes may be provided before, during, and after the method 1000, and that some other processes may be only briefly described herein.

Figure 2A:
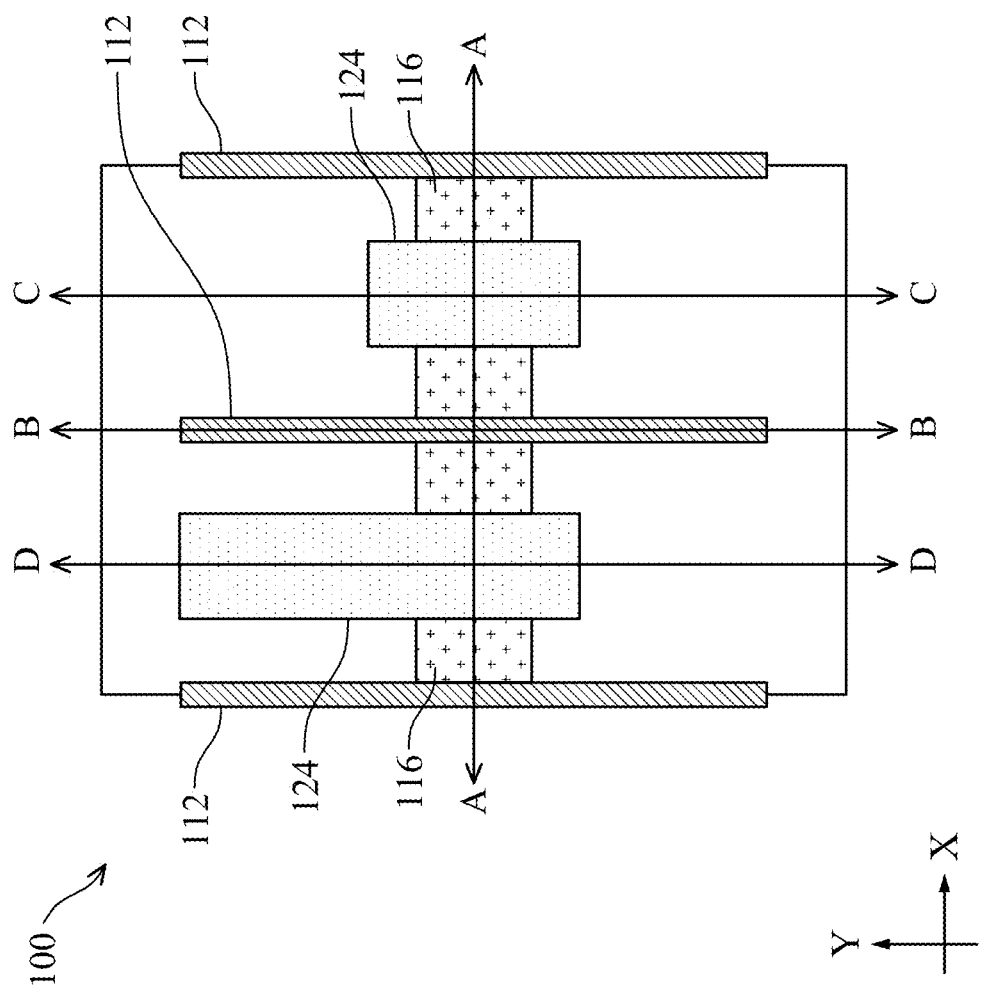

FIG. 2A illustrates a portion of an IC device 100 in accordance with various embodiments, which may be the IC device 180. The IC device 100 may include one or more CFETs, which will be described in greater detail with reference to FIGS. 2B-15D. The IC device 100 includes gate electrodes 112, source/drain regions 116 and source/drain contacts 124. Cross-sectional lines A-A, B-B, C-C and D-D are shown in FIG. 2A. The cross-sectional line A-A is an X-directional line that passes through the gate electrodes 112, the source/drain regions 116 and the source/drain contacts 124. The cross-sectional line B-B is a Y-directional line that passes through one of the gate electrodes 112. The cross-sectional lines C-C, D-D are Y-directional lines that pass through the respective source/drain regions 116 on either side of the cross-sectional line B-B.

Figure 2B:
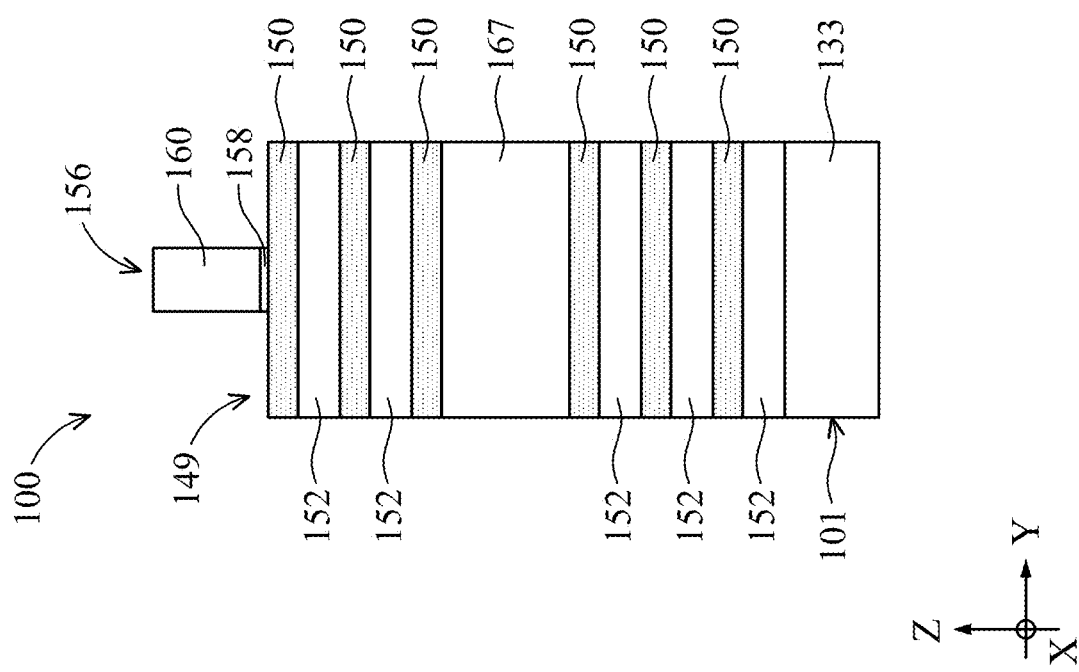

FIG. 2B is a cross-sectional Y-view of the IC device 100 at an intermediate stage of production, in accordance with some embodiments. In FIG. 2B, a multilayer lattice 149 includes a plurality of semiconductor layers 150 and a plurality of sacrificial semiconductor layers 152, 167 stacked on the substrate 102. The sacrificial semiconductor layers 152, 167 are positioned between the semiconductor layers 150. As will be described in more detail below, the semiconductor layers 150 will eventually be patterned to form semiconductor nanostructures 106/107 that correspond to channel regions of complementary transistors 104/105 that collectively make up the CFET 102. The multilayer lattice 149 may be termed a hybrid nanostructure, or may be patterned to form a hybrid nanostructure as will be described in more detail below.

The sacrificial semiconductor layers 152 includes a semiconductor material different than the semiconductor material of the semiconductor layers 150. In particular, the sacrificial semiconductor layers 152 include materials that are selectively etchable with respect to the material of the semiconductor layers 150. As will be described in further detail below, the sacrificial semiconductor layers 152 will eventually be patterned to form sacrificial semiconductor nanostructures. The sacrificial semiconductor nanostructures will eventually be replaced by gate metals positioned between the semiconductor nanostructures 106. In one example, the sacrificial semiconductor layers 152 can include a single crystalline semiconductor material such as, but not limited to Si, Ge, SiGe, GaAs, InSb, GaP, GaSb, InALAs, InGaAs, GaSbP, GaAsSb and InP. In an example process described herein, the sacrificial semiconductor layers 152 include SiGe, while the semiconductor layers 150 include Si. Other materials and configurations can be utilized for the sacrificial semiconductor layers 152 and the semiconductor layers 150 without departing from the scope of the present disclosure.

In some embodiments, each semiconductor layer 150 includes intrinsic silicon and each sacrificial semiconductor layer 152 includes silicon germanium. The sacrificial semiconductor layers may have a relatively low germanium concentration of between 10% and 35%. A concentration in this range can provide sacrificial semiconductor layers 152 that are selectively etchable with respect to the semiconductor layers 150. In some embodiments, the semiconductor layers 150 have a thickness between 2 nm and 5 nm. In some embodiments, the sacrificial semiconductor layers 152 have a thickness between 4 nm and 10 nm. Other materials, concentrations, and thicknesses can be utilized for the semiconductor layers 150 and the sacrificial semiconductor layers 152 without departing from the scope of the present disclosure.

In some embodiments, the multilayer lattice 149 is formed by performing a series of epitaxial growth processes. A first epitaxial growth process grows the lowest sacrificial semiconductor layer 152 on the semiconductor substrate 133. A second epitaxial growth process grows the lowest semiconductor layer 150 on the lowest sacrificial semiconductor layer 152. Alternating epitaxial growth processes are performed to form the four lowest sacrificial semiconductor layers 152 and the three lowest semiconductor layers 150. Depending on the number of semiconductor nanostructures desired for the lower transistor 105 of the CFET 102, more or fewer sacrificial semiconductor layers 152 and semiconductor layers 150 can be formed.

After the semiconductor layers 150 and sacrificial semiconductor layers 152 associated with the lower transistor 105 have been formed, the sacrificial semiconductor layer 167 will be formed. In particular, an epitaxial growth process is performed to form the sacrificial semiconductor layer 167. In one example, the sacrificial semiconductor layer 167 is silicon germanium having a thickness between 1 nm and 25 nm and a length between 15 nm and 30 nm. The thickness of the sacrificial semiconductor layer 167 is greater than the thickness of the sacrificial semiconductor layers 152. The thickness of the sacrificial semiconductor layers 152 is greater than the thickness of the semiconductor layer 150. Other compositions, materials, and thicknesses can be utilized for the sacrificial semiconductor layer 167 without departing from the scope of the present disclosure.

After formation of the sacrificial semiconductor layer 167, the upper sacrificial semiconductor layers 152 and semiconductor layers 150 associated with the upper transistor 104 are formed. The upper sacrificial semiconductor layers 152 and semiconductor layers 150 can be formed with alternating epitaxial growth processes as described in relation to the lower semiconductor layers 150 and sacrificial semiconductor layers 152.

A mask layer 160 is formed and patterned over the multilayer lattice 149. In some embodiments, an optional layer 158 is formed between the multilayer lattice 149 and the mask layer 160, as shown. The optional layer 158 may be, for example, a dielectric layer that includes an oxide of the semiconductor material of the top semiconductor layer 150. The optional layer 158 is omitted from view in FIG. 2C.

Figure 2C:
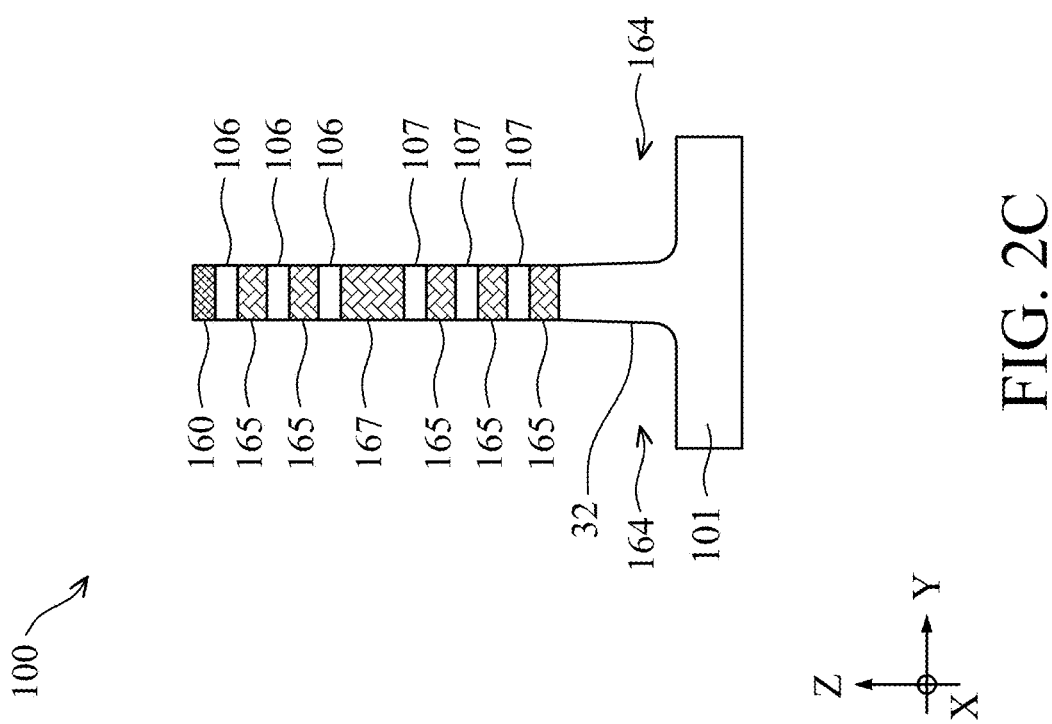
Figure 24:
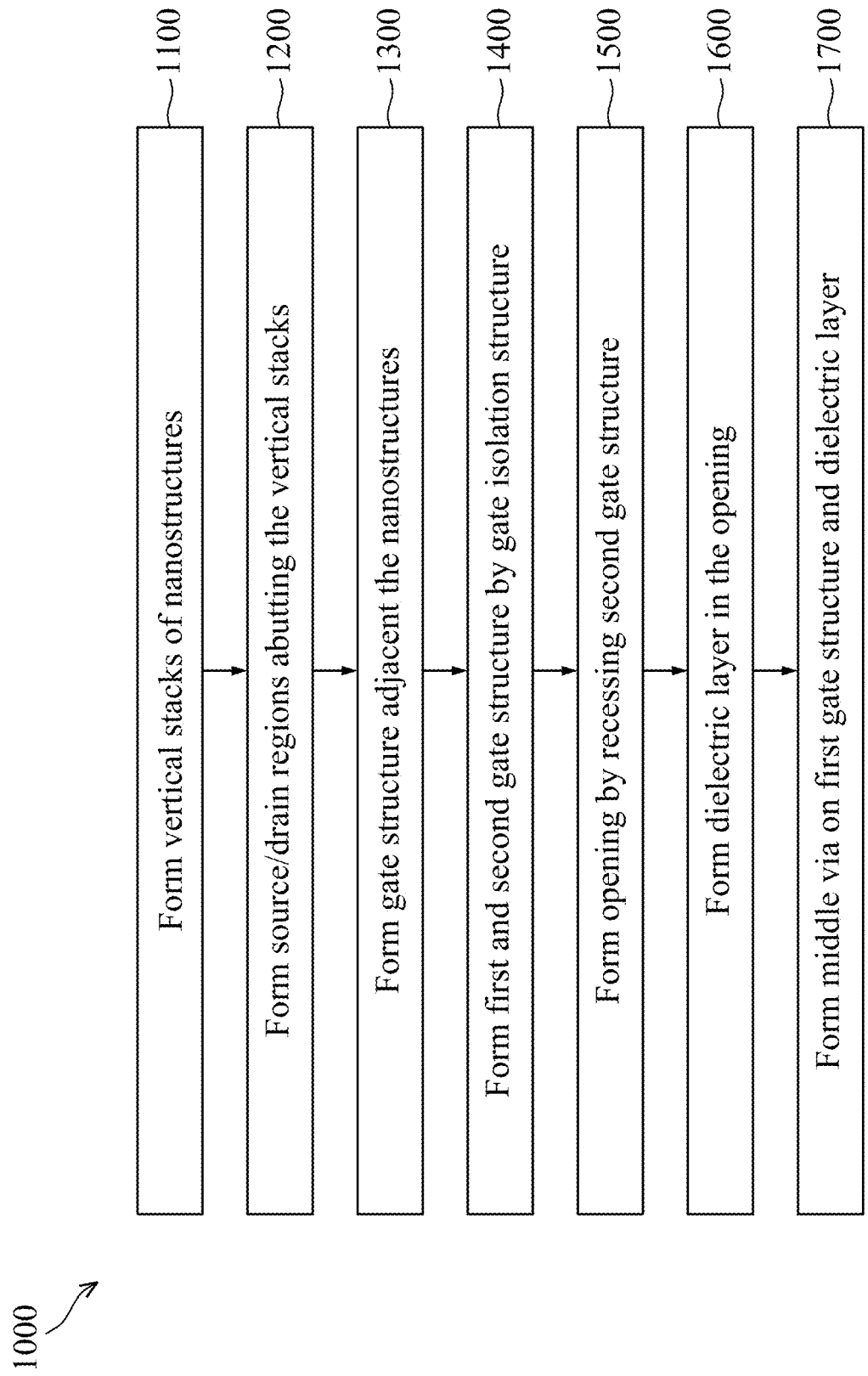
FIG. 24 is a flowchart illustrating method of fabricating a semiconductor device according to various aspects of the present disclosure.

In FIG. 2C, fins or "fin structures" 32 are formed in the substrate 101 and nanostructures 106, 107 are formed in the multilayer lattice 149 corresponding to operation 1100 of FIG. 24. In some embodiments, the nanostructures 106, 107, 165, 168 and the fins 32 may be formed by etching trenches 164 in the multilayer lattice 149 and the substrate 101. The etching may be any acceptable etch process, such as a reactive ion etch (RIE), neutral beam etch (NBE), the like, or a combination thereof. The etching may be anisotropic. First nanostructures 106, 107 (also referred to as "channels" below) are formed from the semiconductor layers 150, and second nanostructures 165, 168 are formed from the sacrificial semiconductor layers 152, 167. Distance between adjacent fins 32 and nanostructures 106, 107, 165, 168 in the Y-axis direction may be from about 18 nm to about 100 nm, although other distances that are less than 18 nm or greater than 100 nm are also contemplated embodiments herein.

The fins 32 and the nanostructures 106, 107, 165, 168 may be patterned by any suitable method. For example, one or more photolithography processes, including double-patterning or multi-patterning processes, may be used to form the fins 32 and the nanostructures 106, 107, 165, 168. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 32.

FIG. 2C illustrates the fins 32 having tapered sidewalls, such that a width of each of the fins 32 and/or the nanostructures 106, 107, 165, 168 continuously increases in a direction towards the substrate 101. In such embodiments, each of the nanostructures 106, 107, 165, 168 may have a different width and be trapezoidal in shape. In other embodiments, the sidewalls are substantially vertical (non-tapered), such that width of the fins 32 and the nanostructures 106, 107, 165, 168 is substantially similar, and each of the nanostructures 106, 107, 165, 168 is rectangular in shape.

Figure 3:
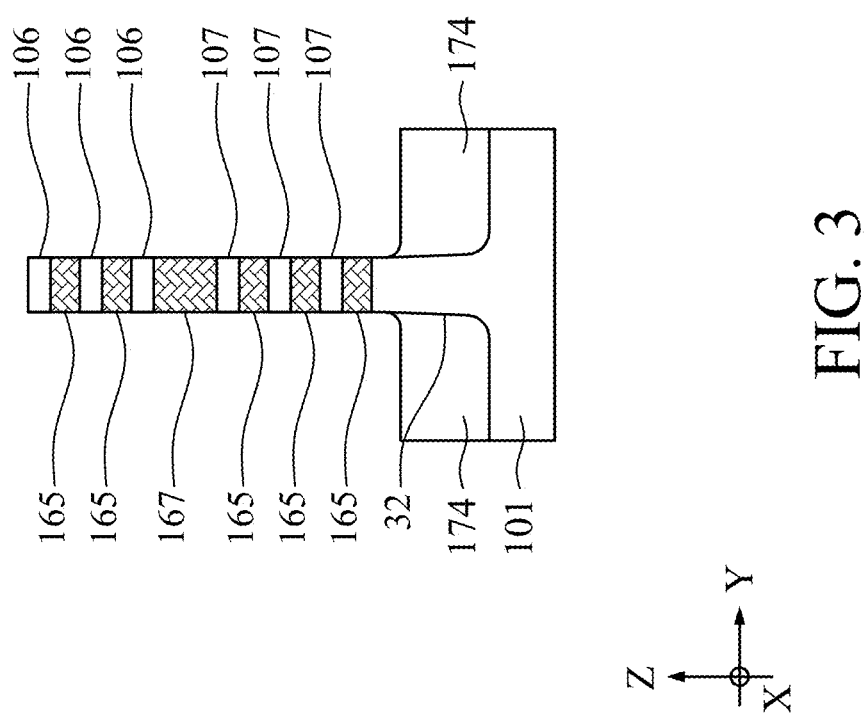

In FIG. 3, isolation regions 174, which may be shallow trench isolation (STI) regions, are formed adjacent the fins 32 following formation of the trenches 164. The isolation regions 174 may be formed by depositing an insulation material over the substrate 101, the fins 32, and nanostructures 106, 107, 165, 167, and between adjacent fins 32 and nanostructures 106, 107, 165, 167. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 101, the fins 32, and the nanostructures 106, 107, 165, 167. Thereafter, a fill or core material, such as those discussed above may be formed over the liner.

The insulation material undergoes a removal process, such as a chemical mechanical polish (CMP), an etch-back process, combinations thereof, or the like, to remove excess insulation material over the nanostructures 106, 107, 165, 167. Top surfaces of the nanostructures 106, 107, 165, 167 may be exposed and level with the insulation material after the removal process is complete.

The insulation material is then recessed to form the isolation regions 174. After recessing, the nanostructures 106, 107, 165, 167 and upper portions of the fins 32 may protrude from between neighboring isolation regions 174. The isolation regions 174 may have top surfaces that are flat, convex, concave, as illustrated, or a combination thereof. In some embodiments, the isolation regions 174 are recessed by an acceptable etching process, such as an oxide removal using, for example, dilute hydrofluoric acid (dHF), which is selective to the insulation material and leaves the fins 32 and the nanostructures 106, 107, 165, 167 substantially unaltered.

Further in FIG. 3, appropriate wells (not separately illustrated) may be formed in the fins 32, the nanostructures 106, 107, 165, 167, and/or the isolation regions 174. Using masks, an n-type impurity implant may be performed in p-type regions of the substrate 101, and a p-type impurity implant may be performed in n-type regions of the substrate 101. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 32 and the nanostructures 106, 107, 165, 167 may obviate separate implantations, although in situ and implantation doping may be used together.

Figures 4A, 4B, 4C:
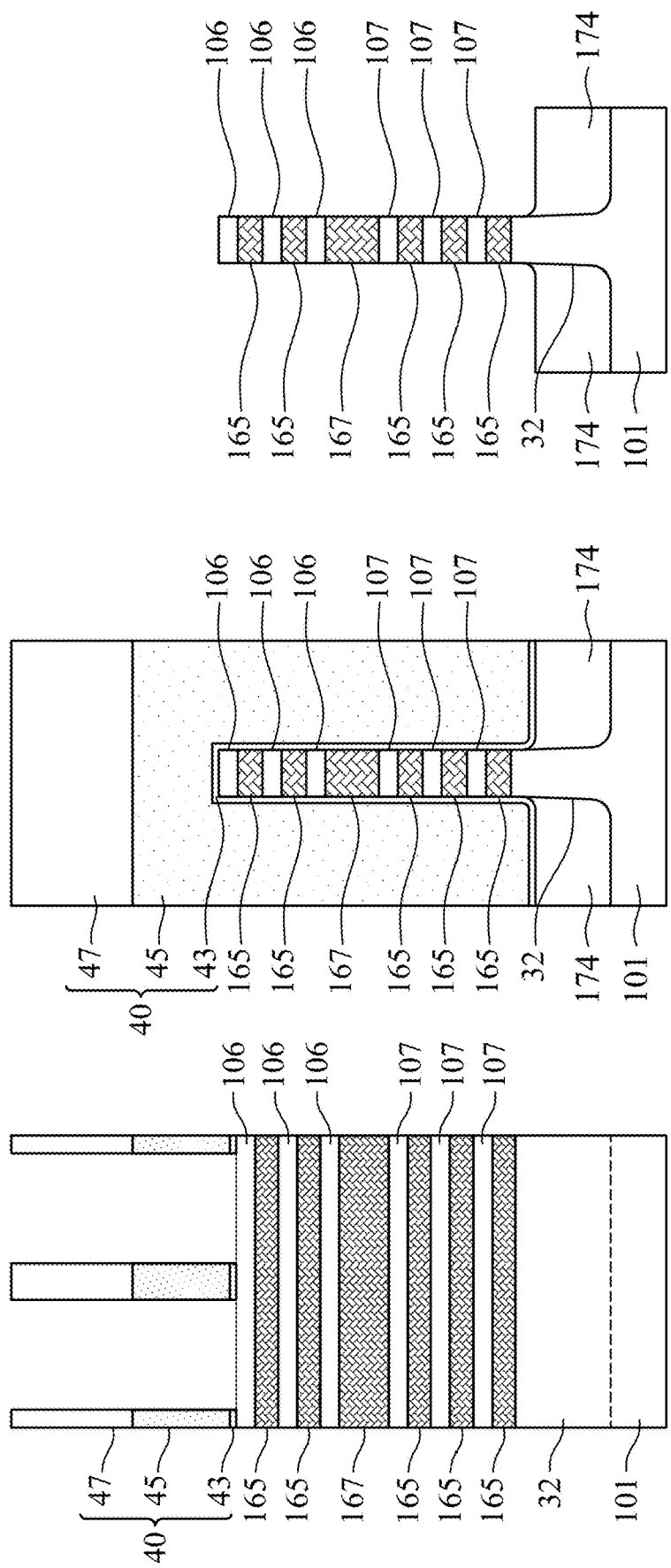

In FIGS. 4A-4C, dummy or sacrificial gate structures 40 are formed over the fins 32 and/or the nanostructures 106, 107, 165, 167. A dummy or sacrificial gate layer 45 is formed over the fins 32 and/or the nanostructures 106, 107, 165, 167. The dummy gate layer 45 may be made of materials that have a high etching selectivity versus the isolation regions 174. The dummy gate layer 45 may be a conductive, semiconductive, or non-conductive material and may be or include one or more of amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47 is formed over the dummy gate layer 45, and may include, for example, silicon nitride, silicon oxynitride, or the like. In some embodiments, a gate dielectric layer (not illustrated for simplicity) is formed before the dummy gate layer 45 between the dummy gate layer 45 and the fins 32 and/or the nanostructures 106, 107, 165, 167.

Figures 5A, 5B, 5C:
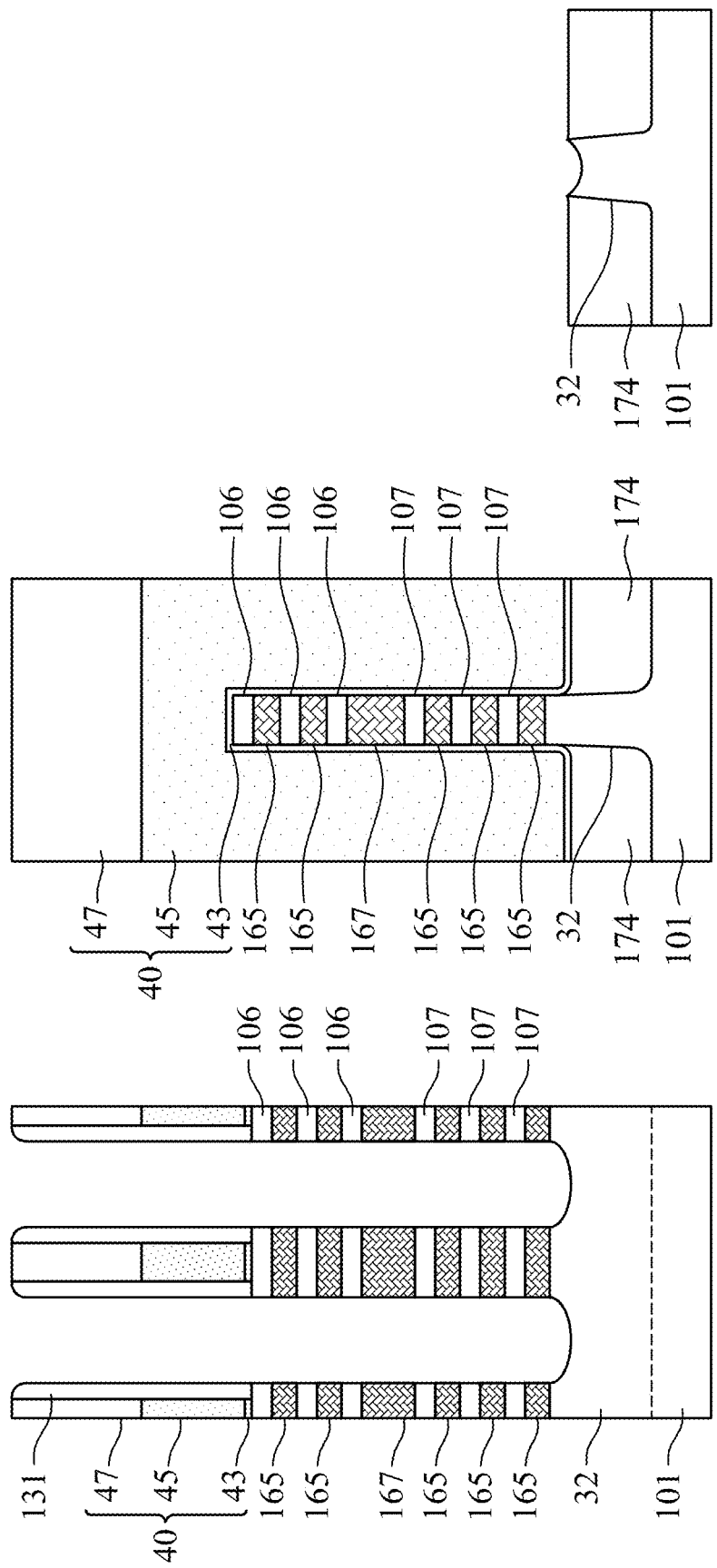

In FIGS. 5A-5C, a spacer layer 131 is formed over sidewalls of the mask layer 47 and the dummy gate layer 45. The spacer layer 131 is made of an insulating material, such as silicon nitride, silicon oxide, silicon carbo-nitride, silicon oxynitride, silicon oxy carbo-nitride, or the like, and may have a single-layer structure or a multi-layer structure including a plurality of dielectric layers, in accordance with some embodiments. The spacer layer 131 may be formed by depositing a spacer material layer (not shown) over the mask layer 47 and the dummy gate layer 45. Portions of the spacer material layer between dummy gate structures 40 are removed using an anisotropic etching process, in accordance with some embodiments.

In FIGS. 5A-5C, an etching process is performed to etch the portions of protruding fins 32 and/or nanostructures 106, 107, 165, 167 that are not covered by dummy gate structures 40, resulting in the structure shown. The recessing may be anisotropic, such that the portions of fins 32 directly underlying dummy gate structures 40 and the spacer layer 41 are protected, and are not etched. The top surfaces of the recessed fins 32 may be substantially coplanar with the top surfaces of the isolation regions 174 as shown, in accordance with some embodiments. The top surfaces of the recessed fins 32 may be lower than the top surfaces of the isolation regions 174, in accordance with some other embodiments.

Figures 6A, 6B, 6C:
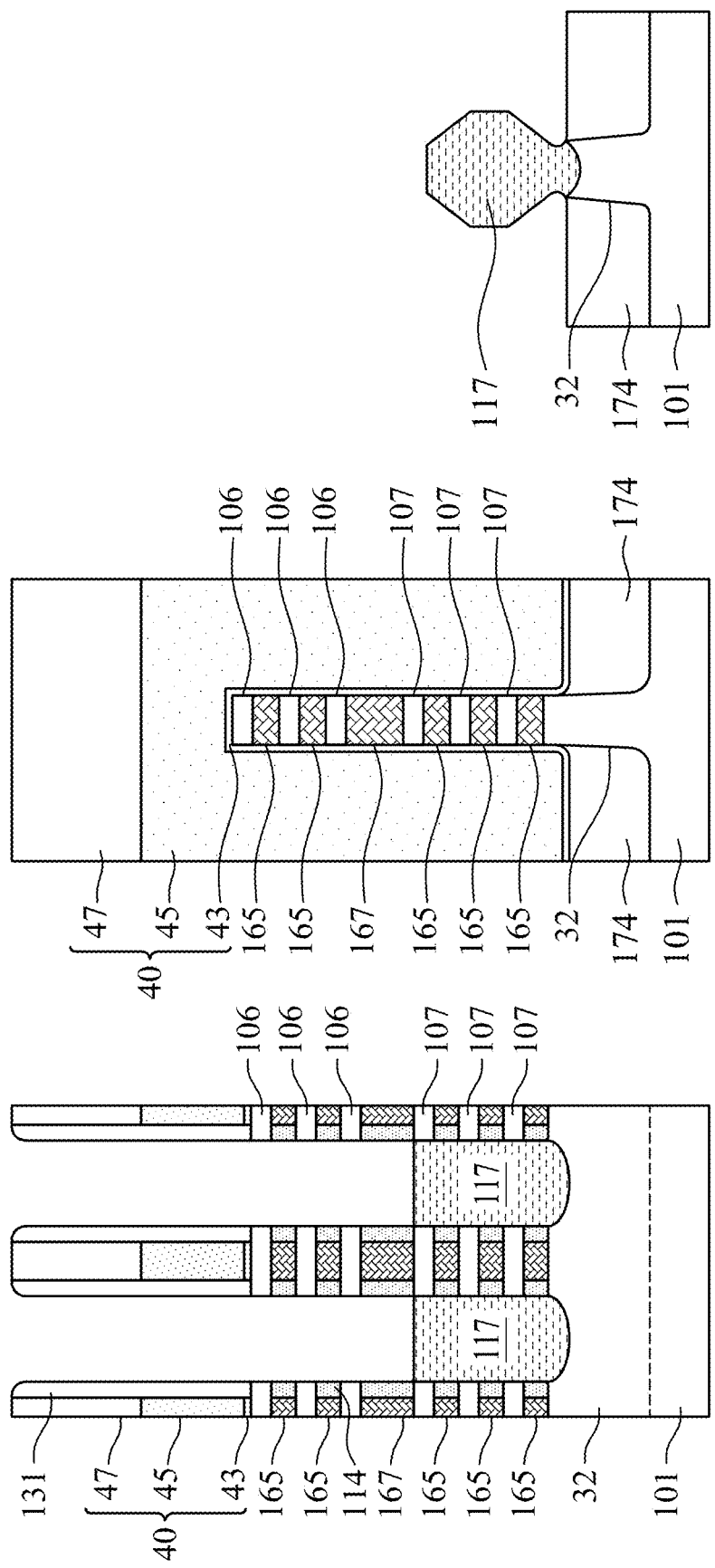

FIGS. 6A-6C illustrate formation of inner spacers 114. A selective etching process is performed to recess end portions of the nanostructures 165, 167 exposed by openings in the spacer layer 131 without substantially attacking the nanostructures 106, 107. After the selective etching process, recesses are formed in the nanostructures 165, 167 at locations where the removed end portions used to be.

Next, an inner spacer layer is formed to fill the recesses in the nanostructures 165, 167 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 165, 167. The remaining portions of the inner spacer layers (e.g., portions disposed inside the recesses in the nanostructures 165, 167) form the inner spacers 114. The resulting structure is shown in FIG. 6A.

FIGS. 6A-6C illustrate formation of lower source/drain regions 117 corresponding to operation 1200 of FIG. 24. A bottom isolation layer may be formed on a bottom surface of the S/D trenches prior to formation of the lower source/drain regions 117, and is omitted from view for simplicity of illustration. Formation of the bottom isolation layer may include various processes. For example, an isolation layer may be deposited over the dummy gate structures 40, along the sidewalls of the gate spacers 131 and in the S/D trenches. In some embodiments, the isolation layer includes a dielectric material having a different selectivity from the gate spacers 131. For example, the isolation layer includes an isolation material such as SiO, SiN, aluminum oxide (Al2O3), other isolation material, or combinations thereof.

The isolation layer can be deposited by CVD, PVD, ALD, other suitable process, or combinations thereof. The isolation layer has a thickness over the bottom surface of the S/D trenches (e.g., the exposed surface of the fin structure 32 in the S/D trenches) that is in a range of about 1 nm to about 10 nm, such that the isolation layer is thin enough to leave enough space for the future formed S/D feature and is thick enough to ensure the isolation function over the recessed fin portion in the S/D region. The isolation layer being too thin may cause the bottom isolation layer to be broken during later etching process(es), such that the S/D feature may be epitaxially grown from the fin structure 32 and cause bulk leakage therebetween.

In the illustrated embodiment, the lower source/drain regions 117 are epitaxially grown from epitaxial material(s). When the bottom isolation layer is present, the lower source/drain regions 117 may grow epitaxially outward from sidewalls of the channels 107, and may merge in the space laterally between the channels 107 in the S/D trenches. When the bottom isolation layer is not present, such as is shown in FIG. 6A, the lower source/drain regions 117 may grow epitaxially outward from the fin 32 and the sidewalls of the channels 107. In some embodiments, the lower source/drain regions 117 exert stress in the respective channels 107, thereby improving performance. The lower source/drain regions 117 are formed such that each dummy gate structure 40 is disposed between respective neighboring pairs of the lower source/drain regions 117. In some embodiments, the spacer layer 131 separates the lower source/drain regions 117 from the dummy gate layer 45 by an appropriate lateral distance to prevent electrical bridging to subsequently formed gates of the resulting device.

Figures 7A, 7B, 7C:
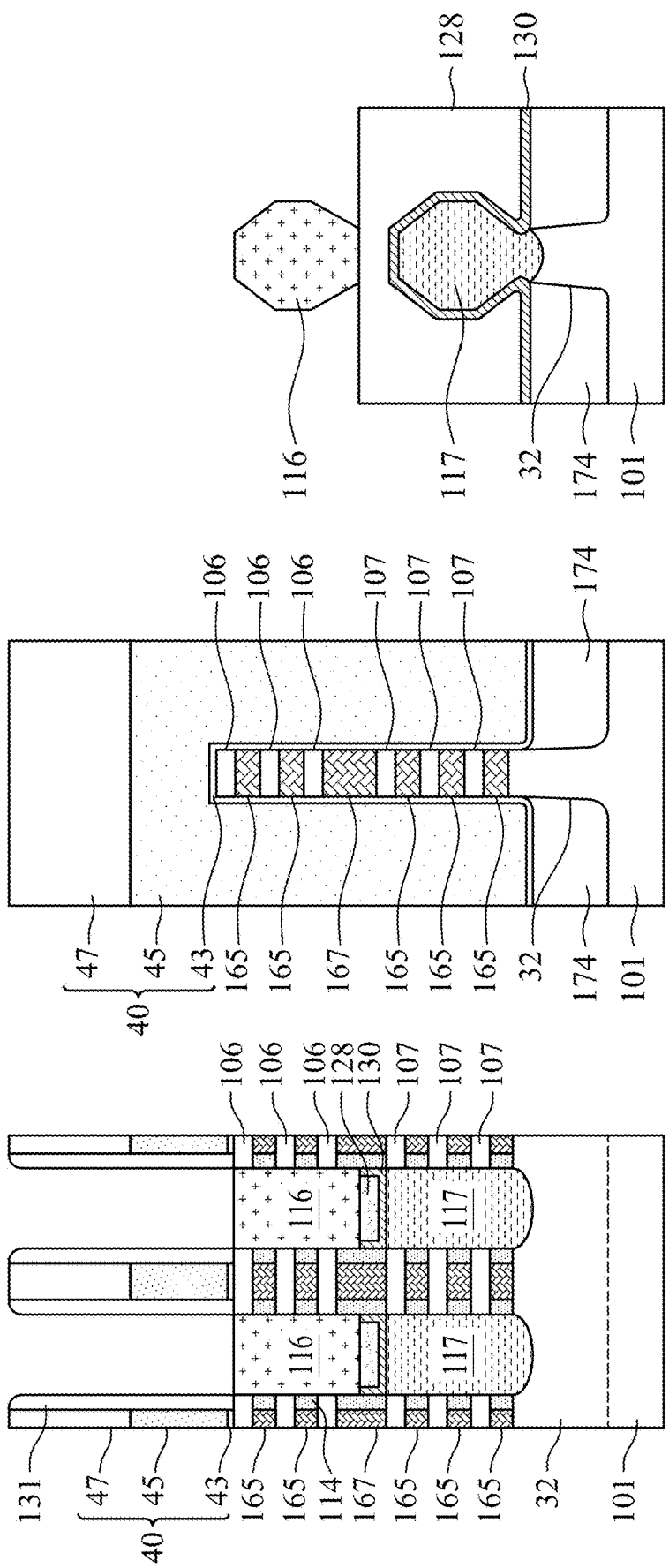

The lower source/drain regions 117 may include any acceptable material, such as appropriate for n-type or p-type devices. For n-type devices, the lower source/drain regions 117 include materials exerting a tensile strain in the channel regions, such as silicon, SiC, SiCP, SiP, SiAs or the like, in some embodiments. When p-type devices are formed, the lower source/drain regions 117 include materials exerting a compressive strain in the channel regions, such as Si:B, SiGe:B, SiGeB, Ge, GeSn, or the like, in accordance with certain embodiments. The lower source/drain regions 117 may have surfaces raised from respective surfaces of the fins 32 and may have facets, as illustrated in FIG. 7C. Neighboring lower source/drain regions 117 may merge in some embodiments to form a singular source/drain region 117 adjacent two neighboring fins 32.

The lower source/drain regions 117 may be implanted with dopants followed by an anneal. The lower source/drain regions 117 may have an impurity concentration of between about $10^{19}$ cm$^{-3}$ and about $10^{21}$ cm$^{-3}$. N-type and/or p-type impurities for lower source/drain regions 117 may be any of the impurities previously discussed. In some embodiments, the lower source/drain regions 117 are in situ doped during growth.

In FIGS. 7A-7C, a lower contact etch stop layer (CESL) 130 and lower interlayer dielectric (ILD) 128 are then formed covering the dummy gate structures 40 (not shown in Figures) and the lower source/drain regions 117 (shown in FIG. 7C, for example). The lower CESL 130 may be or include a dielectric material, such as SiN, SiCN, or the like, which may be formed as a conformal layer by a first deposition operation, such as a PVD, CVD, ALD, or the like. The lower ILD 128 may be or include an oxide layer, such as silicon oxide. In some embodiments, the lower ILD 128 may be or include carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like. The lower ILD 128 may be formed by a second deposition operation, which may be a PVD, CVD, ALD, or the like. Following deposition of the lower ILD 128, excess portions of the lower ILD 128 overlying the dummy gate structures 40 and the lower source/drain regions 117 may be removed by one or more suitable removal operations, such as a CMP, an etch, or other removal operation. The material of the lower ILD 128 may be recessed by the one or more removal operations to a level that is between the uppermost channel 107 and the lowermost channel 106, as shown in FIG. 7A.

In FIGS. 7A-7C, following formation of the lower ILD 128, upper source/drain regions 116 are formed. In the illustrated embodiment, the upper source/drain regions 116 are epitaxially grown from epitaxial material(s). Due to presence of the lower ILD 128, the upper source/drain regions 116 grow epitaxially outward from sidewalls of the channels 106, and merge in the space laterally between the channels 106 in the S/D trenches. In some embodiments, the upper source/drain regions 116 exert stress in the respective channels 106, thereby improving performance. The upper source/drain regions 116 are formed such that each dummy gate structure 40 is disposed between respective neighboring pairs of the upper source/drain regions 116. In some embodiments, the spacer layer 131 separates the upper source/drain regions 116 from the dummy gate layer 45 by an appropriate lateral distance to prevent electrical bridging to subsequently formed gates of the resulting device.

The upper source/drain regions 116 may include any acceptable material, such as appropriate for n-type or p-type devices. For n-type devices, the upper source/drain regions 116 include materials exerting a tensile strain in the channel regions, such as silicon, SiC, SiCP, SiP, SiAs or the like, in some embodiments. When p-type devices are formed, the upper source/drain regions 116 include materials exerting a compressive strain in the channel regions, such as SiGe, SiGeB, Ge, GeSn, or the like, in accordance with certain embodiments. The upper source/drain regions 116 may be implanted with dopants followed by an anneal. The upper source/drain regions 116 may have an impurity concentration of between about $10^{19}$ cm$^{-3}$ and about $10^{21}$ cm$^{-3}$. N-type and/or p-type impurities for upper source/drain regions 116 may be any of the impurities previously discussed. In some embodiments, the upper source/drain regions 116 are in situ doped during growth.

The upper source/drain regions 116 may have facets, as illustrated in FIG. 7C. Neighboring upper source/drain regions 116 may merge in some embodiments to form a singular source/drain region 116 adjacent two neighboring fins 32. In embodiments in which the bottom isolation layer is not present, such that the lower source/drain regions 117 are grown epitaxially from the fins 32, the upper source/drain regions 116 and the lower source/drain regions 117 may have different profile in the XZ plane and the YZ plane, as shown in FIGS. 7A and 7C. For example, the upper source/drain regions 116 grow laterally outward from the channels 106, and the lower source/drain regions 117 grow laterally outward from the channels 107 and upward from the fins 32. As such, the bottom surfaces of the respective upper source/drain regions 116 may be flat (e.g., inheriting the profile of the lower ILD 128), and the bottom surfaces of the respective lower source/drain regions 117 may be convex (e.g., inheriting the profile of the fins 32). The lower source/drain regions 116 may have a protrusion portion that extends downward below the lower CESL 130, as shown in FIG. 7C. The upper source/drain regions 117 may not extend downward below an upper CESL 130A that is formed in a later operation (see FIGS. 8A-8C, for example). In some embodiments, the bottom surface of the upper source/drain regions 117 is substantially coplanar with the bottom surface of the upper CESL 130A and/or the upper surface of the lower ILD 128.

The source/drain regions 116 include a semiconductor material. The semiconductor material can include a same semiconductor material as the semiconductor nanostructures 106. Alternatively, the semiconductor material of the source/drain regions 116 can be different than the semiconductor material of the semiconductor nanostructures 106.

Figures 8A, 8B, 8C:
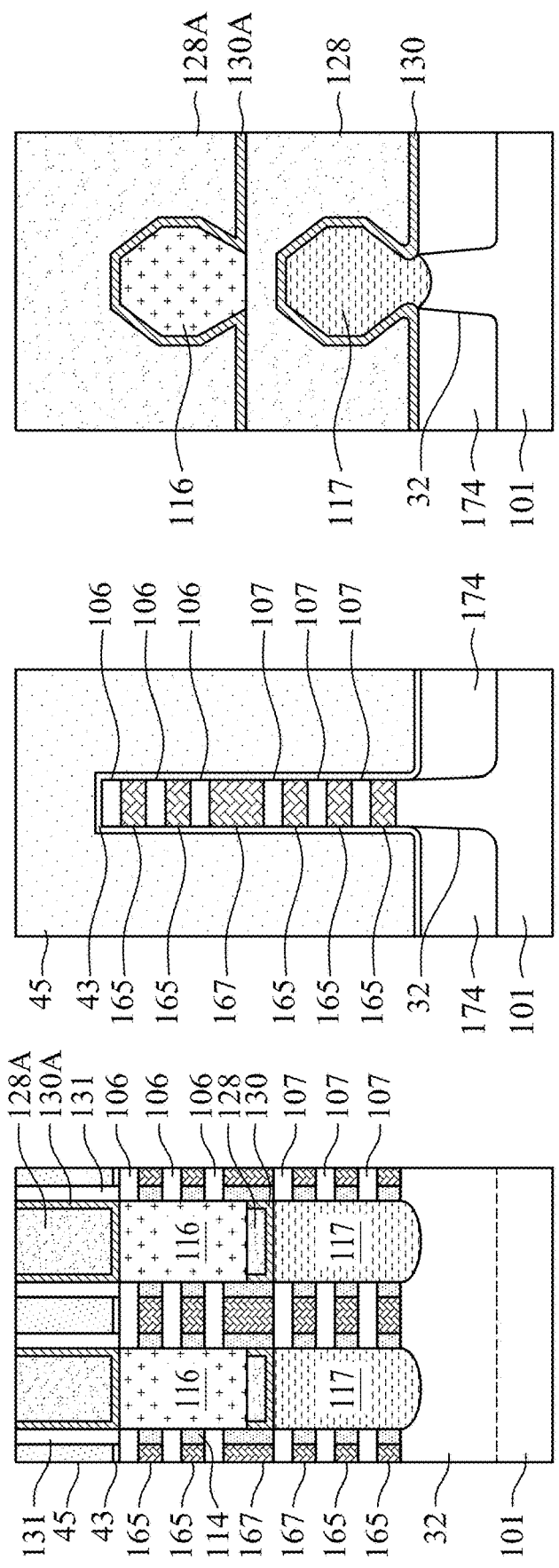

In FIGS. 8A-8C, the upper contact etch stop layer (CESL) 130A and an upper interlayer dielectric (ILD) 128A are then formed covering the dummy gate structures 40 (not shown in Figures) and the upper source/drain regions 116 (shown in FIG. 8C, for example). The upper CESL 130A may be or include a dielectric material, such as SiN, SiCN, or the like, which may be formed as a conformal layer by a first deposition operation, such as a PVD, CVD, ALD, or the like. The upper ILD 128A may be or include an oxide layer, such as silicon oxide. In some embodiments, the upper ILD 128A may be or include carbon doped silicon dioxide, silicon oxynitride, borosilicate glass (BSG), phosphoric silicate glass (PSG), borophosphosilicate glass (BPSG), fluorinated silicate glass (FSG), a porous dielectric material, or the like. The upper ILD 128A may be formed by a second deposition operation, which may be a PVD, CVD, ALD, or the like. Following deposition of the upper ILD 128A, excess portions of the upper ILD 128A overlying the dummy gate structures 40 and the upper source/drain regions 116 may be removed by one or more suitable removal operations, such as a CMP, an etch, or other removal operation. The material of the upper ILD 128A, the sidewall spacer 131 and the dummy gate structures 40 are recessed by the one or more removal operations such that the sacrificial gate layer 45 is exposed, as shown in FIG. 8A. Following the one or more removal operations, upper surfaces of the sacrificial gate layer 45, the sidewall spacers 131, the upper CESL 130A and the upper ILD 128A may be substantially coplanar.

Figures 9A, 9B, 9C:
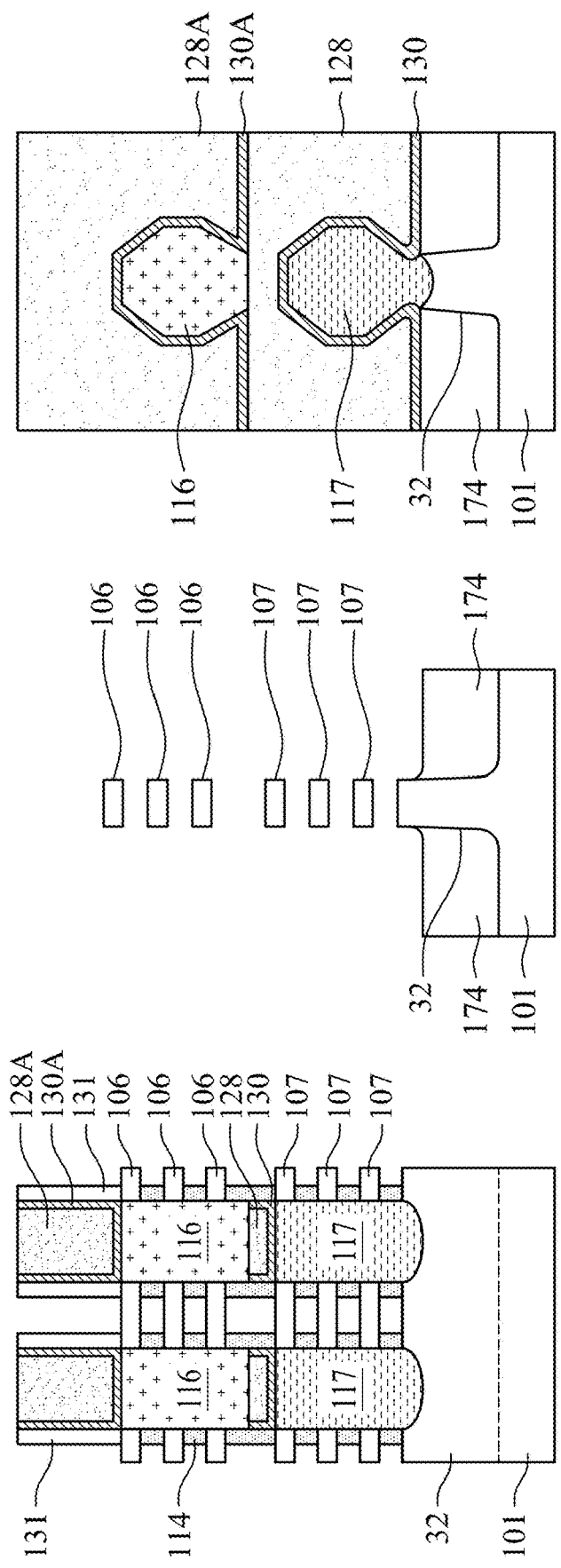

FIGS. 9A-9C illustrate release of channels 106, 107 by removal of the nanostructures 165, 167 and the dummy gate layer 45, which corresponds to act 1300 of FIG. 24. Following the planarization process that was performed to level the top surfaces of the sacrificial gate layer 45 and sidewall spacers 131, the top surfaces of the dummy gate layer 45 are exposed.

Next, the dummy gate layer 45 is removed in an etching process, so that recesses are formed. In some embodiments, the dummy gate layer 45 is removed by an anisotropic dry etch process. For example, the etching process may include a dry etch process using reaction gas(es) that selectively etch the dummy gate layer 45 without etching the spacer layer 131. The dummy gate dielectric, when present, may be used as an etch stop layer when the dummy gate layer 45 is etched. The dummy gate dielectric may then be removed after the removal of the dummy gate layer 45.

The nanostructures 165, 167 are removed to release the nanostructures 106, 107. After the nanostructures 165, 167 are removed, the nanostructures 106, 107 form a plurality of nanosheets that extend horizontally (e.g., parallel to a major upper surface of the substrate 110). The nanosheets may be collectively referred to as the channels 106, 107 of the nanostructure device 10 formed.

In some embodiments, the nanostructures 165, 167 are removed by a selective etching process using an etchant that is selective to the material of the nanostructures 165, 167, such that the nanostructures 165, 167 are removed without substantially attacking the nanostructures 106, 107. In some embodiments, the etching process is an isotropic etching process using an etching gas, and optionally, a carrier gas, where the etching gas comprises F2 and HF, and the carrier gas may be an inert gas such as Ar, He, N2, combinations thereof, or the like.

In some embodiments, the nanosheets 106, 107 of the nanostructure device 10 are reshaped (e.g. thinned) by a further etching process to improve gate fill window. The reshaping may be performed by an isotropic etching process selective to the nanosheets 106, 107. After reshaping, the nanosheets 106, 107 may exhibit a dog bone shape in which middle portions of the nanosheets 106, 107 are thinner than peripheral portions of the nanosheets 106, 107 along the X direction.

In FIGS. 10A-10C, after removal of the sacrificial semiconductor nanostructures 165, 167 a gap remains where the sacrificial semiconductor nanostructures 165, 167 were. The semiconductor nanostructures 106, 107 are exposed. An interfacial gate dielectric layer (or simply "interfacial layer") 108 and the high-K gate dielectric layer 110 are then deposited on and wrapping around the semiconductor nanostructures 106, 107. The interfacial gate dielectric layer 108 may include silicon oxide, SiON, SiN, HfSiO, or the like, and may have thickness between 2 Å and 10 Å. The high-K dielectric layer 110 is deposited on the interfacial dielectric layer 108 and may include hafnium oxide, HfSiO, ZrO or another suitable high-k dielectric material. The high-K dielectric layer 110 may have a thickness between 5 Å and 20 Å. The materials of the gate dielectric layers 108 and 110 may be deposited by ALD, CVD, or PVD. Other structures, materials, thicknesses, and deposition processes may be utilized for the gate dielectric layer without departing from the scope of the present closure.

After deposition of the interfacial gate dielectric layer 108 and the high-K gate dielectric layer 110 around the semiconductor nanostructures 106, 107, a gate metal 112 is deposited. The gate metal 112 may be deposited by PVD, CVD, ALD, or other suitable processes. The material or materials of the gate metal 112 may be selected to provide a desired work function with respect to the semiconductor nanostructures 107 of the P-type transistor 105. In one example, the gate metal 112 includes titanium aluminum. However, other conductive materials can be utilized for the gate metal 112 without departing from the scope of the present disclosure. For example, the gate metal 112 may be or include one or more of W, TiN, Ti, TaN, Ta, Al, Ru, and the like.

When the gate metal 112 is initially deposited, the gate metal 112 surrounds or wraps around the semiconductor nanostructures 106 and the semiconductor nanostructures 107. In some embodiments, the gate metal 112 has a material that provides a desired work function for the lower transistor 105 and the gate metal 112 may not provide a desired work function for the upper transistor 104. Accordingly, an etch-back process may be performed that removes the gate metal 112 to a level well below the lowest semiconductor nanostructure 106. In some embodiments, the etch-back process removes the gate metal 112 to a level that is about the vertical middle of the lower ILD 128, and a second gate metal (not shown) may be formed to replace the gate metal 112 removed previously.

After deposition of the gate metal 112 or optionally after deposition of the second gate metal, an etch-back process is optionally performed to reduce the height of the gate metal 112 above the top semiconductor nanostructure 106. After the etch-back process of the gate metal 112, an optional gate cap metal may be deposited on the gate metal 112. The gate cap metal can include tungsten, fluorine-free tungsten, or other suitable conductive materials. The gate cap metal can be deposited by PVD, CVD, ALD, or other suitable deposition processes. The gate cap metal may have a vertical thickness between 1 nm and 10 nm. Other dimensions can be utilized without departing from the scope of the present disclosure.

Figures 11A, 11B, 11C:
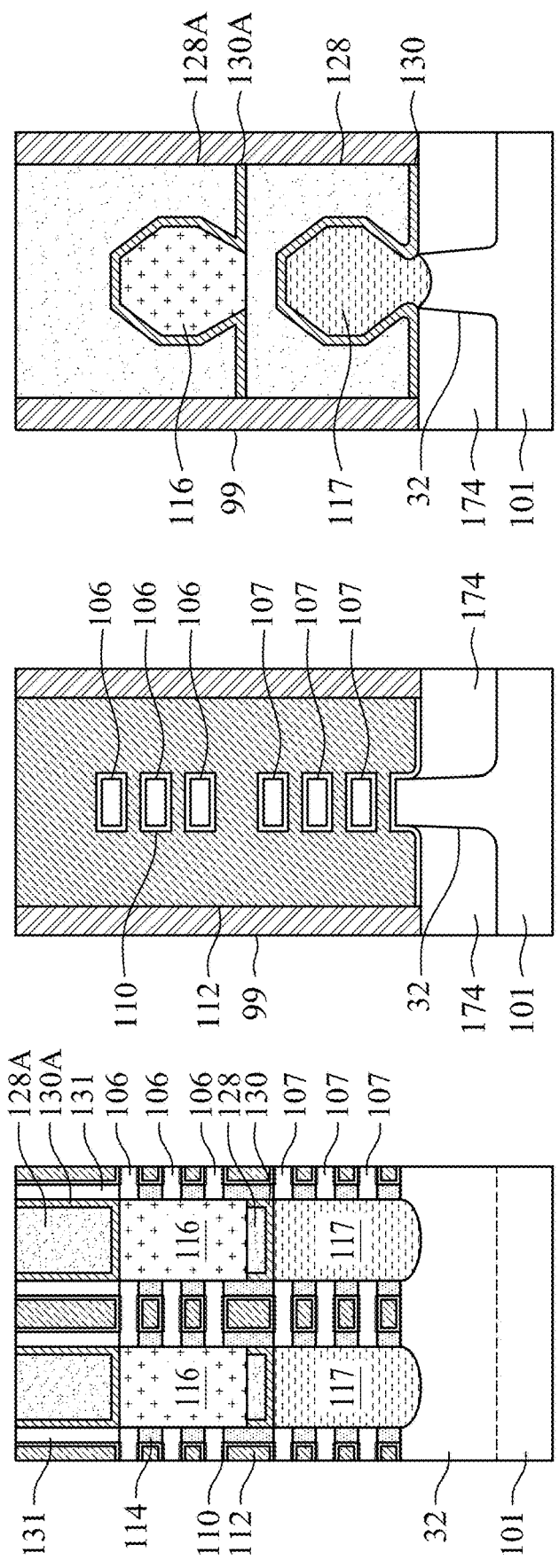

In FIGS. 11A-11C, following formation of the gate metal 112, gate isolation structures 99 are formed, corresponding to act 1400 of FIG. 24. The gate isolation structures 99 may be or include one or more materials that electrically isolate portions of the gate metal 112 from other portions of the gate metal 112. The materials of the gate isolation structures 99 may include SiO2, SiON, SiN, or the like. The gate isolation structures 99 may be multilayers including one or more of the materials just mentioned. Formation of the gate isolation structures 99 may include one or more operations, including photolithography, etching and deposition. One or more mask layers may be formed over the gate metal 112, upper ILD 128A, upper CESL 130A, and sidewall spacers 131. The mask layers may be patterned via photolithography exposure, then exposed or unexposed regions of the mask layers may be removed to form openings therein. Following formation of the openings, exposed regions of the gate metal 112, the upper and lower ILDs 128A, 128 and the upper and lower CESLs 130A, 130 may be removed by one or more etch operations through the openings in the mask layers to form gate isolation openings. Following formation of the gate isolation openings, material(s) of the gate isolation structures 99 is deposited in the gate isolation openings by a suitable deposition operation, which may be a PVD, CVD, ALD, or the like.

In some embodiments, the gate isolation structures 99 extend in a first direction (e.g., the X-axis direction) and are arranged along a second direction (e.g., the Y-axis direction). Width of the gate isolation structures 99 (e.g., in the Y-axis direction) may be in a range of about 5 nm to about 40 nm.

In FIGS. 12A-12D, following formation of the gate isolation structures 99, source/drain contacts 124A, 124B and optional silicides 120A, 120B are formed. In some embodiments, one or more mask layers is formed over the gate metal 112, upper ILD 128A, upper CESL 130A, sidewall spacers 131 and gate isolation structures 99. The mask layers may be patterned via photolithography exposure, then exposed or unexposed regions of the mask layers may be removed to form openings therein. Exposed regions of the upper ILD 128A and the upper CESL 130A may be etched through the openings in the mask layers to form contact openings. One or more of the contact openings, which may be referred to as a first contact opening, may be extended through one of the upper source/drain regions 116, the lower ILD 128 and the lower CESL 130 to expose the lower source/drain region 117. For example, the first contact opening corresponding to the source/drain contact 124B may be etched in a first etching operation while a region corresponding to the source/drain contact 124A is masked, then a second etching operation may be performed that forms a second contact opening corresponding to the source/drain contact 124A and extends the first contact opening.

Following formation of contact openings, the source/drain contacts 124A, 124B may be formed by one or more deposition operations. The source/drain contacts 124A, 124B may include a conductive material such as tungsten, cobalt, ruthenium, iridium, molybdenum, copper, aluminum, or combinations thereof. The source/drain contacts 124A, 124B may be laterally surrounded by barrier layers (not shown), such as SiN or TiN, which help prevent or reduce diffusion of materials from and into the source/drain contacts 124A, 124B.

Figure 12A:
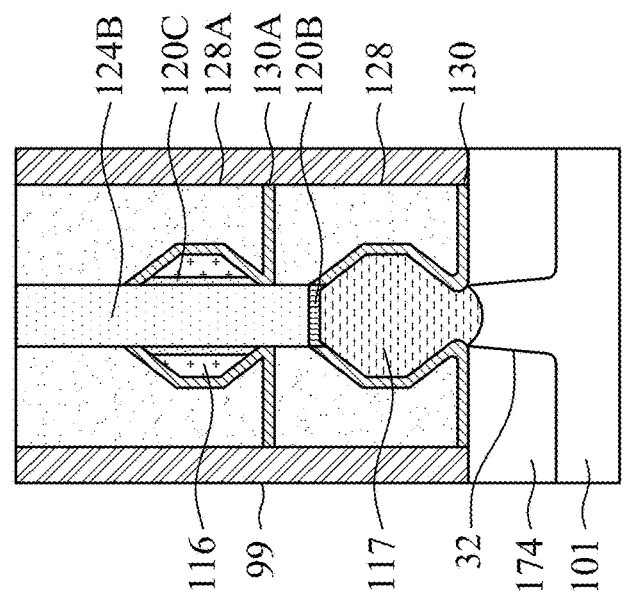
Figure 12B:
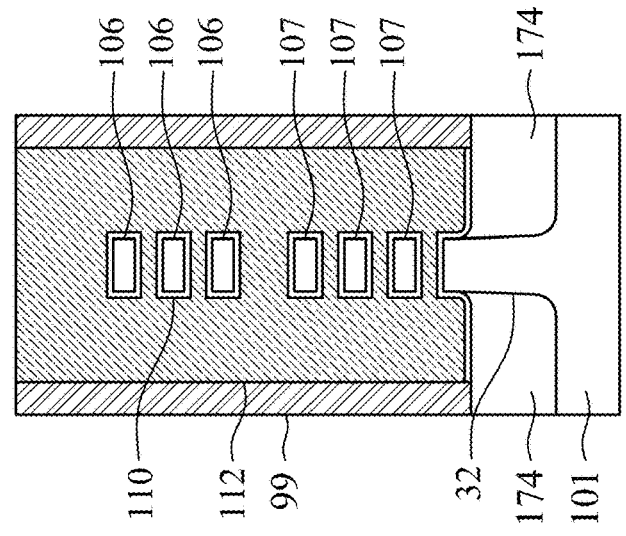
Figure 12C:
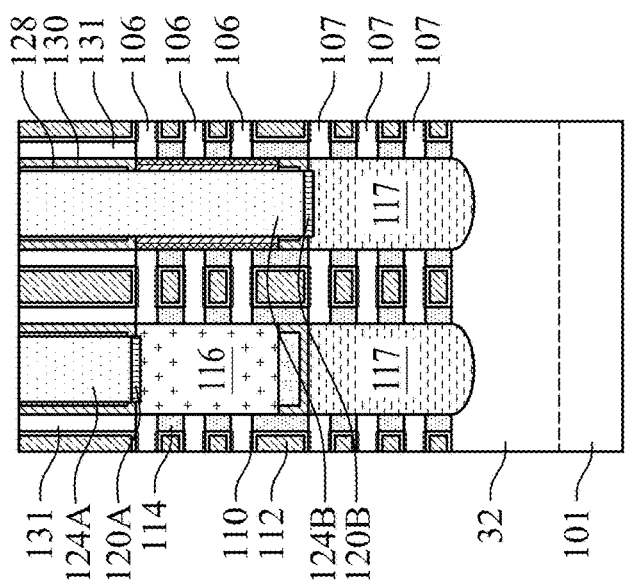
Figure 12D:
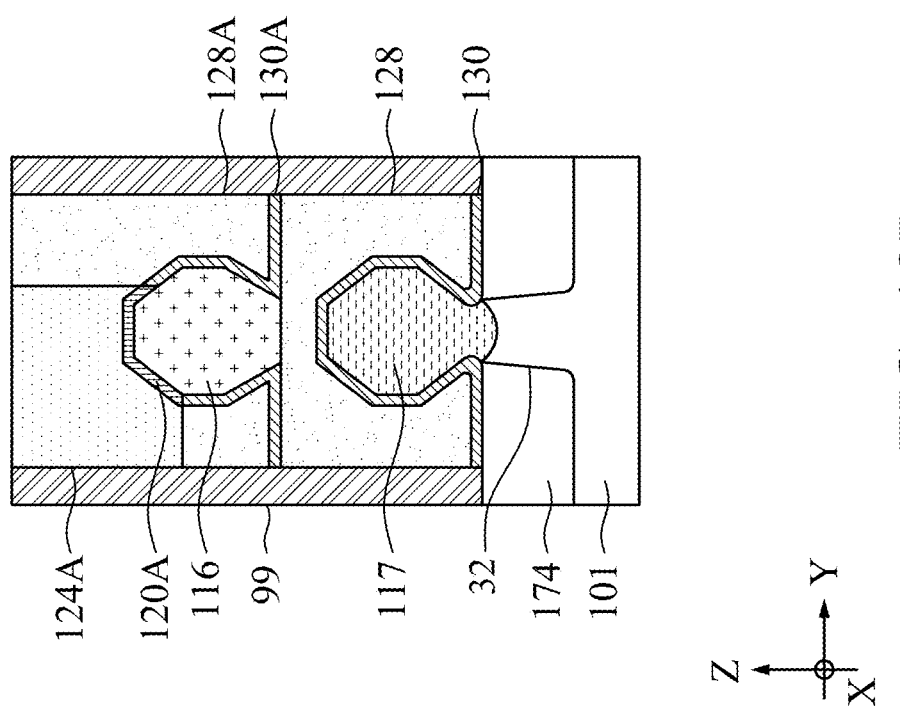
Figures 13A, 13B, 13C:
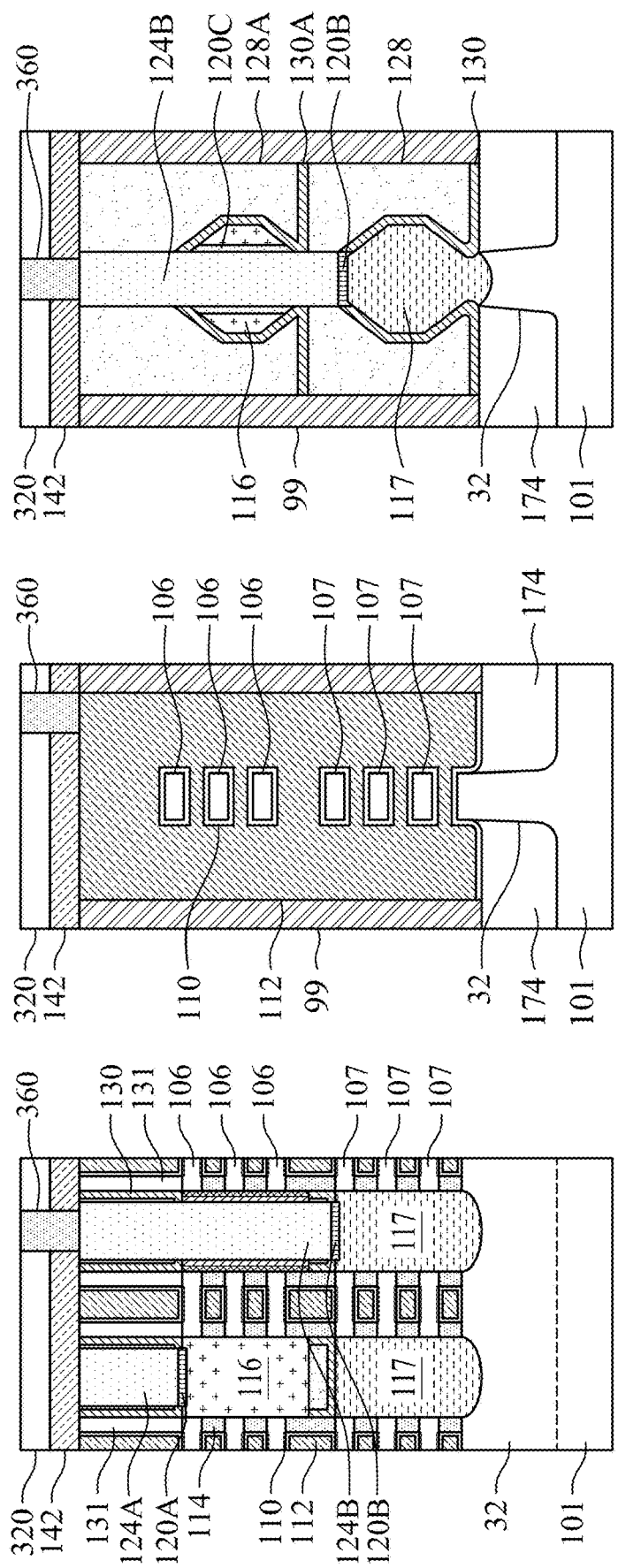
Figure 13D:
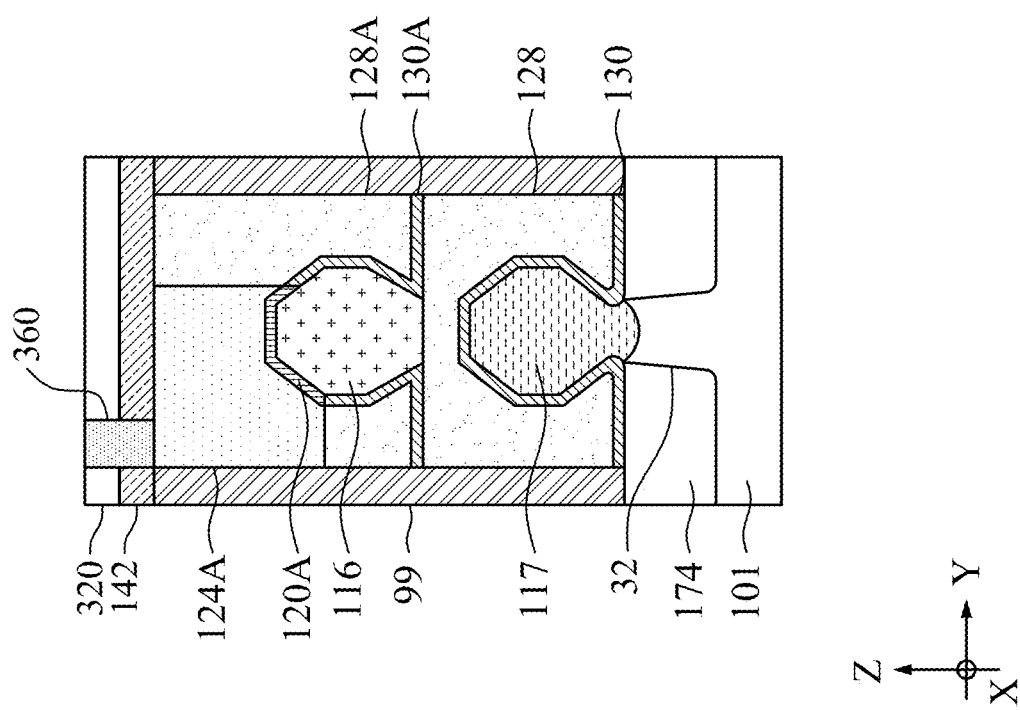
Figures 14A, 14B, 14C:
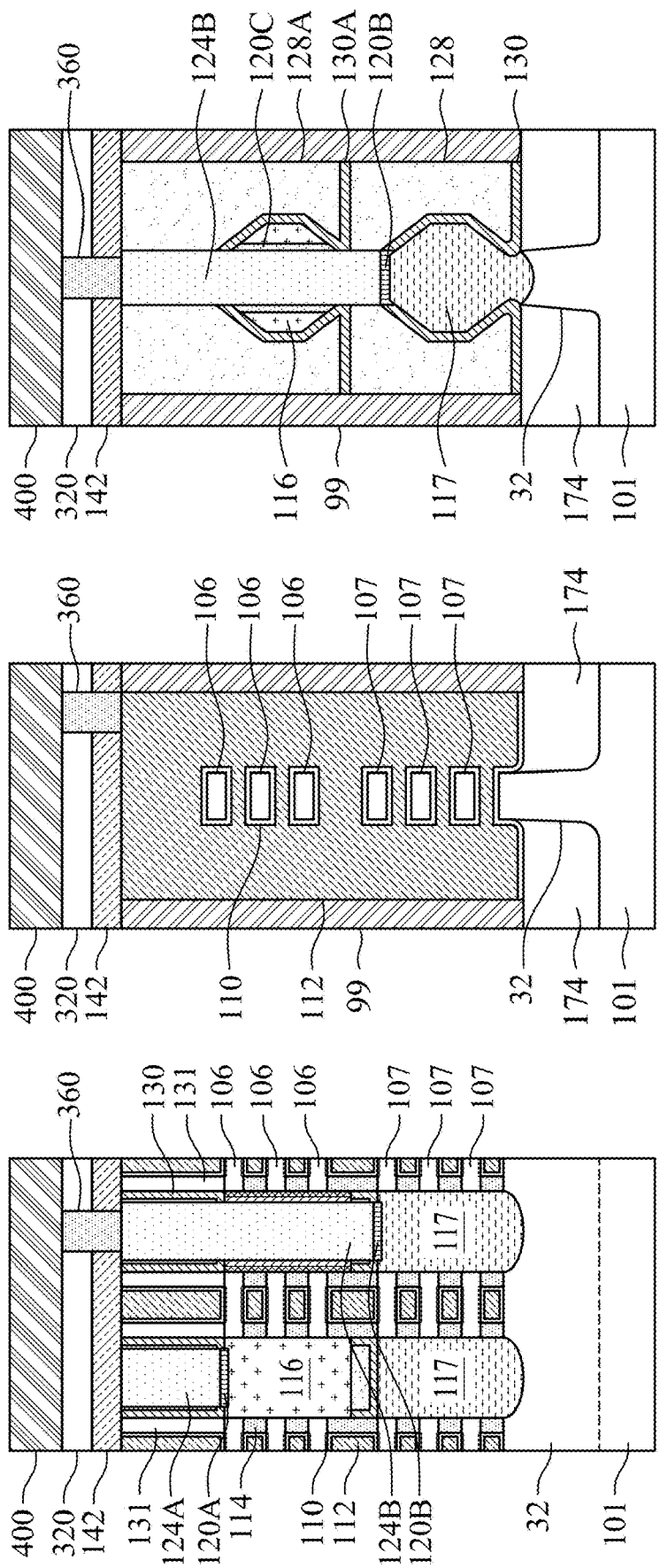
Figure 14D:
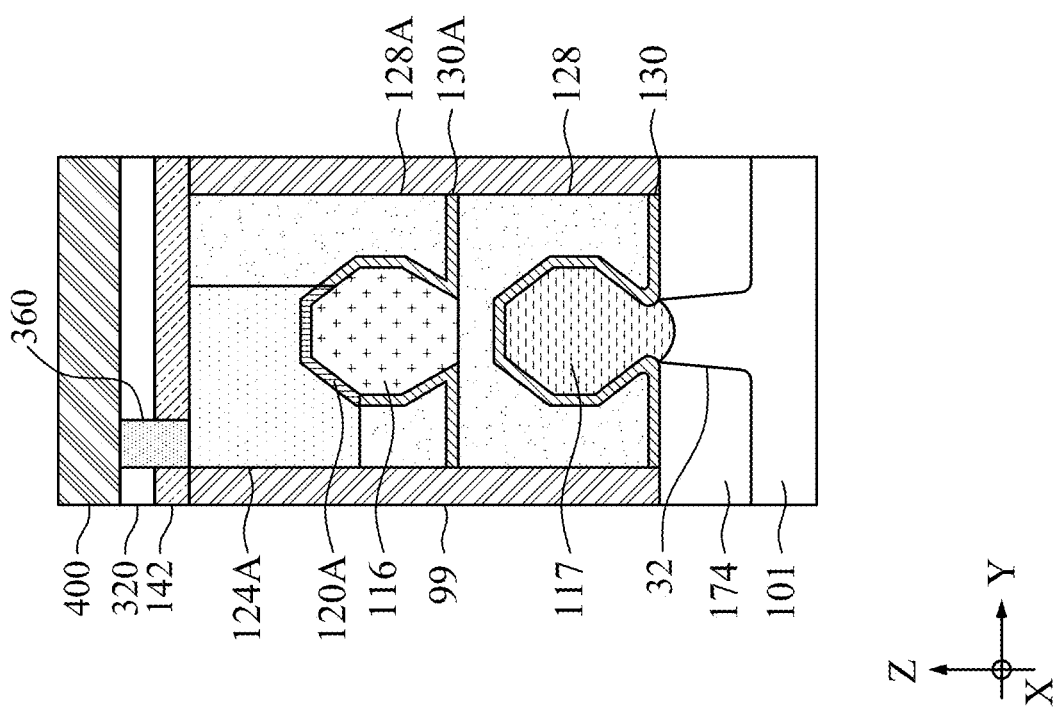

Silicide layers 120A, 120B, 120C may also be formed between the source/drain regions 116, 117 and the source/drain contacts 124A, 124B, which is advantageous to reduce source/drain contact resistance. The silicide layers 120A, 120B, 120C may contain a metal silicide material, such as cobalt silicide in some embodiments, or TiSi in some other embodiments. The silicide layers 120A, 120B may be referred to as horizontal silicide layers, and have major surfaces on the XY plane. The silicide layers 120C may be referred to as vertical silicide layers, and have major surfaces on the XZ plane. The source/drain contact 124B, which extends through the upper source/drain region 116, is adjacent or laterally surrounded by the vertical silicide layer(s) 120C and is adjacent or directly on the horizontal silicide layer 120B, as shown in FIG. 12C. As shown in FIG. 12D, the source/drain contact 124A may extend laterally (e.g., in the Y-axis direction) to abut one of the gate isolation structures 99.

In FIGS. 13A-13D, following formation of the source/drain contacts 124A, 124B, one or more frontside interconnect layers may be formed. Each frontside interconnect layer may include one or more of an ILD and a CESL, and may include metal regions, which may be wires, traces, vias, or the like. A single frontside interconnect layer including a CESL 142, an ILD 320 and a source/drain via 360 is shown in FIGS. 13A-13D. The CESL 142 may be deposited, then the ILD 320 may be deposited on the CESL 142. The ILD 320 and the CESL 142 may be patterned to form one or more openings exposing source/drain contacts 124, such as the source/drain contact 124B shown in FIG. 13A. Then, the source/drain via 360 is formed in the opening by a suitable deposition process, such as a PVD, CVD, ALD, or the like. The source/drain via 360 may include the same material as or different material than the source/drain contact 124B, and may include Ru, W, Al, Cu, Mo, Co, a combination thereof, or the like. Although not specifically illustrated, gate vias may be formed through the ILD 320 and CESL 142 to contact the gate metals 112. One or more of the source/drain vias 360 may contact both a source/drain contact 124 and a gate metal 112.

In FIGS. 14A-14D, additional frontside interconnect layers 400 are formed on the ILD 320 and the source/drain vias 360. Each of the frontside interconnect layers 400 may include one or more of an ILD and a CESL, and may include metal regions, which may be wires, traces, vias, or the like. The frontside interconnect layers 400 are advantageous for forming electrical connections between the source/drains 116, 117 and electrodes of other transistors, capacitors, resistors, and the like. The frontside interconnect layers 400 may be referred to as a frontside back-end-of-line (BEOL) interconnect structure.

Figures 15A, 15B, 15C:
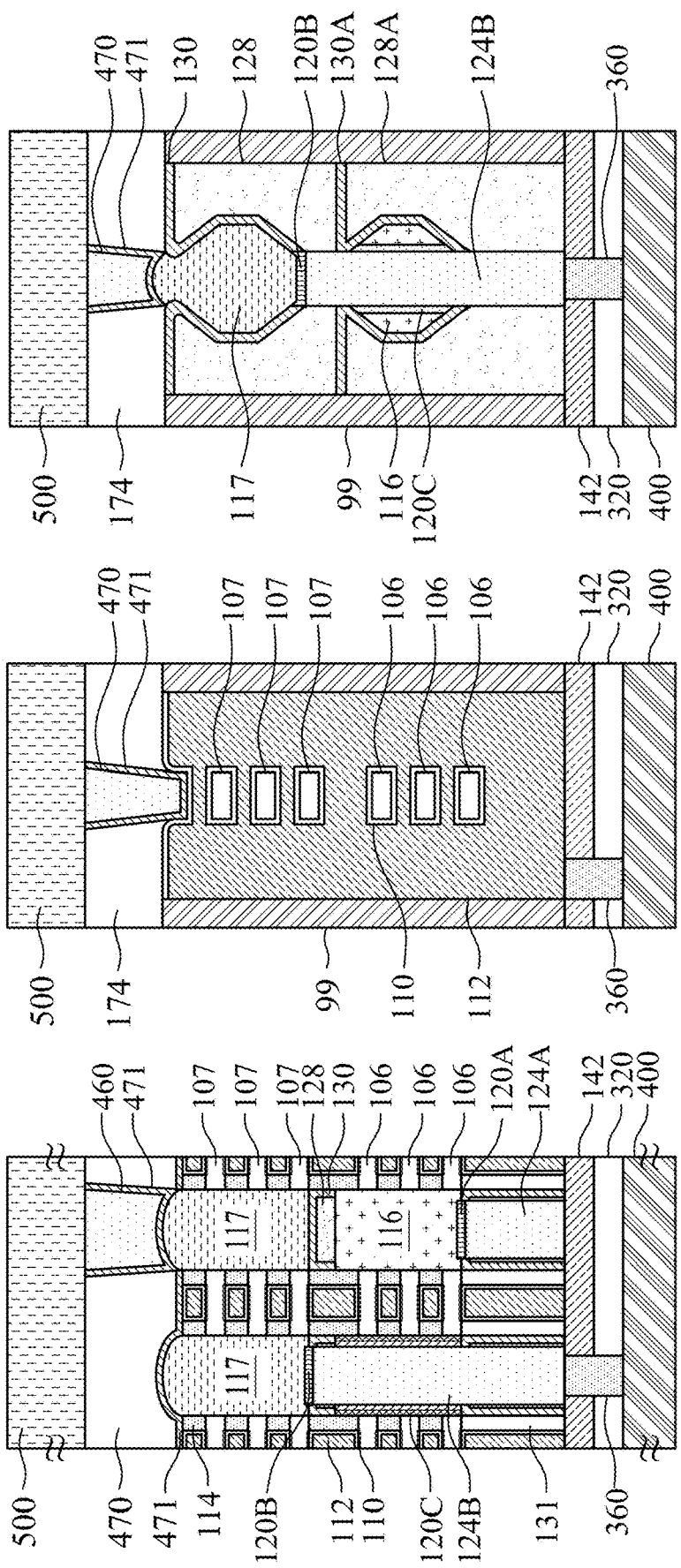
Figure 15D:
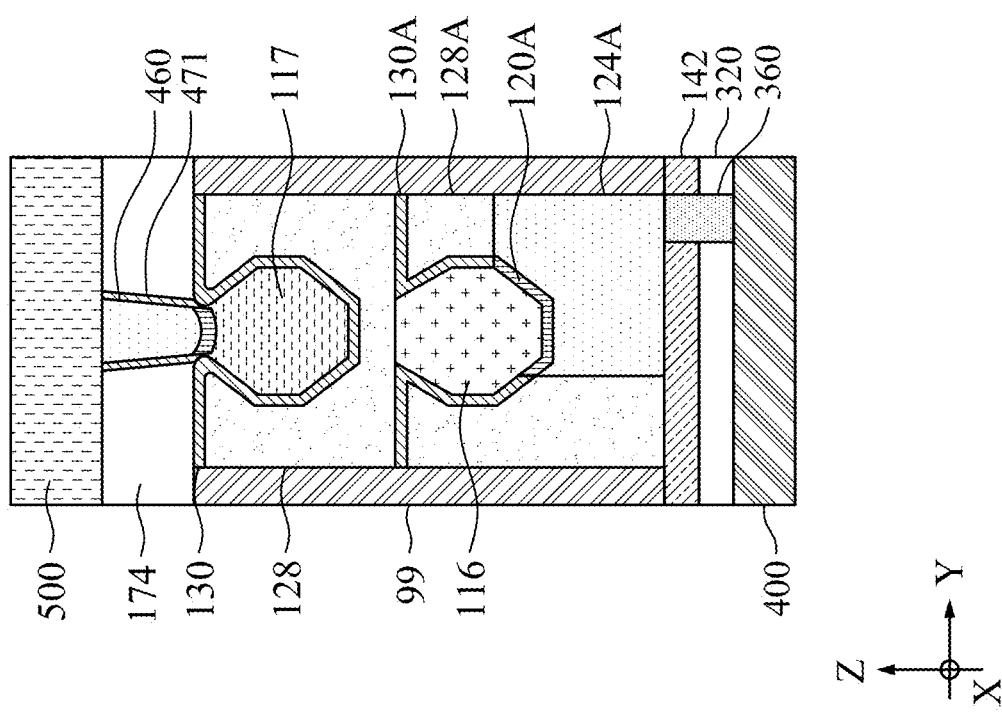

In FIGS. 15A-15D, a backside interconnect structure 500 is formed on a bottom side of the substrate 100. Forming the backside interconnect structure 500 may include attaching a carrier substrate to the frontside of the intermediate structure, flipping the structure over, and performing backside processing on the backside of the intermediate structure. The backside processing may include removing the substrate 101 and removing the fins 32 and optionally the isolation regions 174. Removal of the substrate 101 and the fins 32 and optionally the isolation regions 174 may include one or more removal processes, such as a planarization process, an etching process, or the like. The planarization process may include a CMP, grinding, or the like. In some embodiments, the substrate 101 is removed by a planarization process, thereby exposing the fins 32 and the isolation regions 174. Then, the fins 32 and optionally the isolation regions 174 are removed by one or more etching operations that stop on the underlying structure, e.g., the high-k gate dielectric layer 110, the lower source/drain regions 117, the inner spacers 114 and the gate isolation structures 99. As shown in FIG. 15C, the etching operations may stop on the lower source/drain regions 117. Following removal of the substrate 101, the fins 32 and optionally the isolation regions 174, the bottoms of the lower source/drain regions 117 are exposed.

In FIGS. 15A-15D, the isolation regions 174 are not removed. In such embodiments, after removal of the fins 32, a dielectric liner layer 471 and a dielectric core layer 470 may be formed in openings where the fins 32 were between the isolation regions 174, as shown. Then, the liner layer 471 and the core layer 470 may be patterned to form backside contact openings that expose one or more of the lower source/drain regions 117.

After exposing the lower source/drain regions 117, backside source/drain contacts 460 are formed in the backside contact openings, which may be performed using the same or similar materials and processes used to form the source/drain contacts 124 on the frontside. In some embodiments, the backside source/drain contacts 460 are laterally surrounded by one or more barrier layers, which may be similar or the same as the barrier layers described previously with reference to the source/drain contacts 124.

Following formation of the backside source/drain contacts 460, the backside interconnect structure 500 is formed. The backside interconnect structure 500 may also be referred to as a backside back-end-of-line (BEOL) interconnect structure 500. The backside interconnect structure 500 is similar in many respects to the frontside interconnect structure 400, and may include one or more interconnect layers. Each of the interconnect layers may include a CESL, an ILD, and one or more metal features in the CESL and ILD. The metal features may include vias, wires, traces, and the like. In some embodiments, the backside interconnect structure 500 may include electrical contacts, such as solder bumps, controlled collapse chip connection (C4) bumps, or the like. In some embodiments, the frontside of the IC device 100 is free of electrical contacts.

FIGS. 16A-23C are diagrammatic plan and cross-sectional side views that illustrate formation of L-shaped middle vias 360 in accordance with various embodiments. FIGS. 16A, 17A, 18A and 19A are plan views. FIGS. 16B, 17B, 18B and 19B are cross-sectional side views along the line B-B of FIGS. 16A, 17A, 18A and 19A. FIGS. 16C, 17C, 18C and 19C are cross-sectional side views along the line C-C of FIGS. 16A, 17A, 18A and 19A. FIGS. 16D, 17D, 18D and 19D are cross-sectional side views along the line D-D of FIGS. 16A, 17A, 18A and 19A.

Figure 16B:
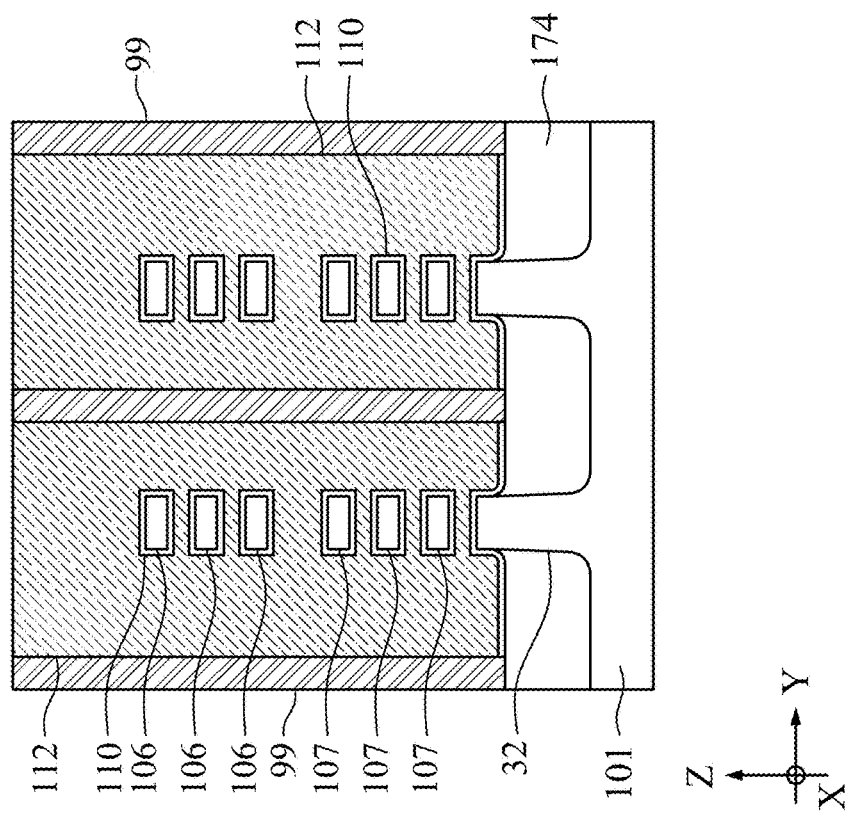
Figure 16A:
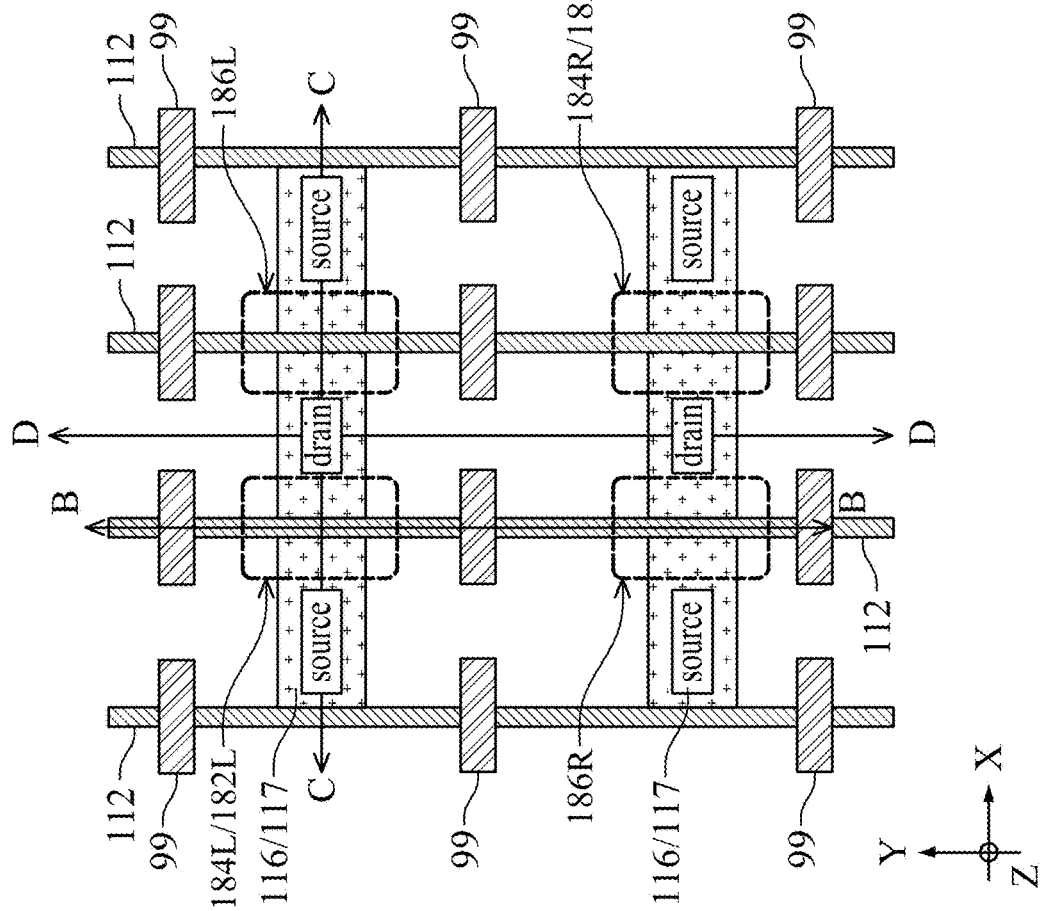
Figure 16D:
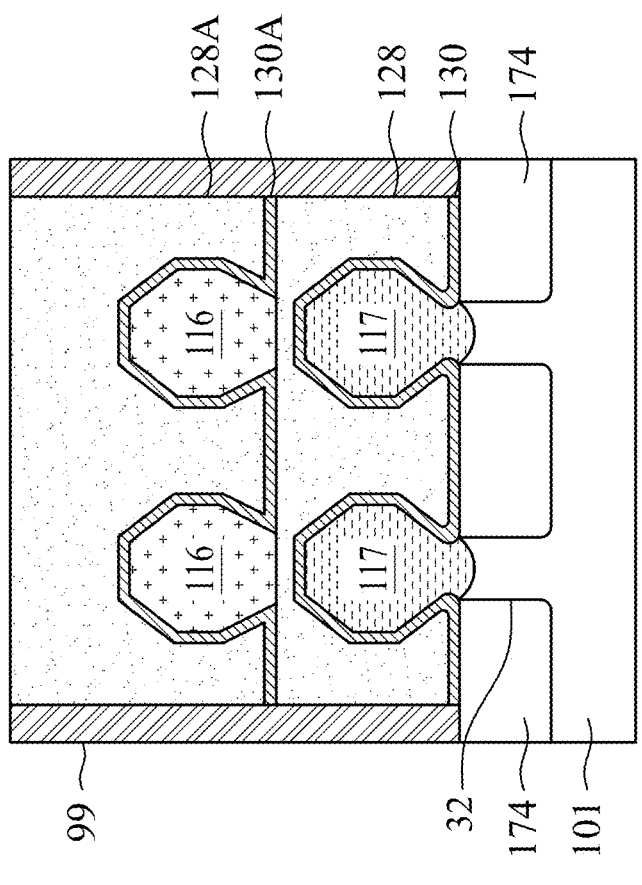
Figure 16C:
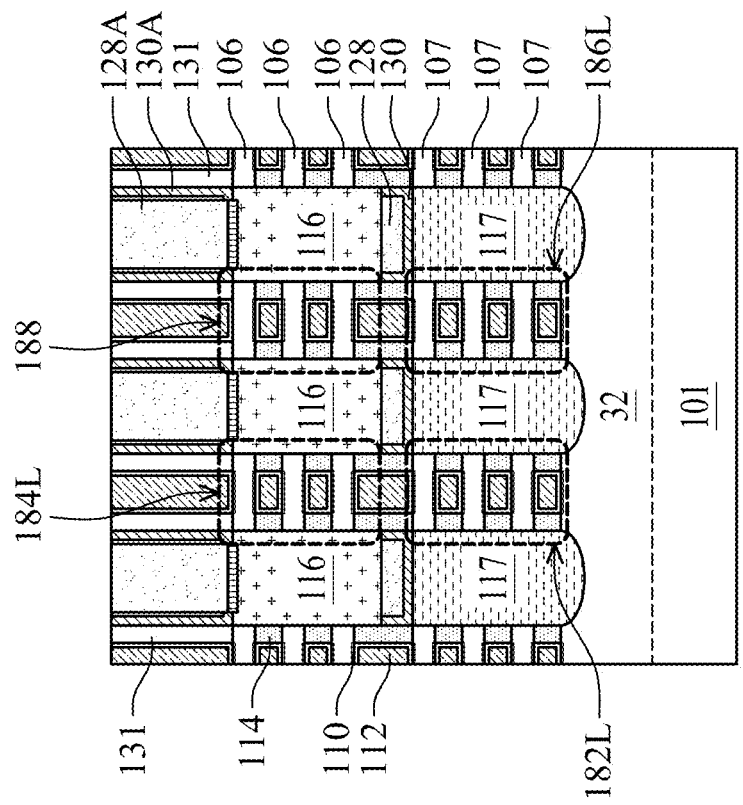

In FIGS. 16A-16D, gate isolation structures 99 are formed in a manner similar to that described with reference to FIGS. 11A-11C. The gate isolation structures 99 extend from the top of the gate metal 112 to the upper surface of the isolation regions 174. FIG. 16A shows relative positions of the transistors 182L, 182R, 184L, 184R, 186L, 186R in phantom. As an example, and as shown in FIG. 16C, the pull-down transistor 184L is disposed above the pull-up transistor 182L, and the pass gate transistor 186L is adjacent the pull-up transistor 182L in the X-axis direction. A transistor 188 directly above the pass gate transistor 186L is removed in a subsequent operation, and may be referred to as a dummy or sacrificial transistor 188.

In FIGS. 17A-17D, a dielectric layer 99A is formed following formation of the gate isolation structures 99, corresponding to acts 1500 and 1600 of FIG. 24. The dielectric layer 99A may be formed by one or more photolithography operations that form an opening exposing the gate metal 112 of the dummy transistor 188. The gate metal 112 is etched or recessed through the opening (act 1500). Following removal of the gate metal 112, the nanostructure channels 106 of the dummy transistor 188 are removed entirely or partially.

Figure 17D:
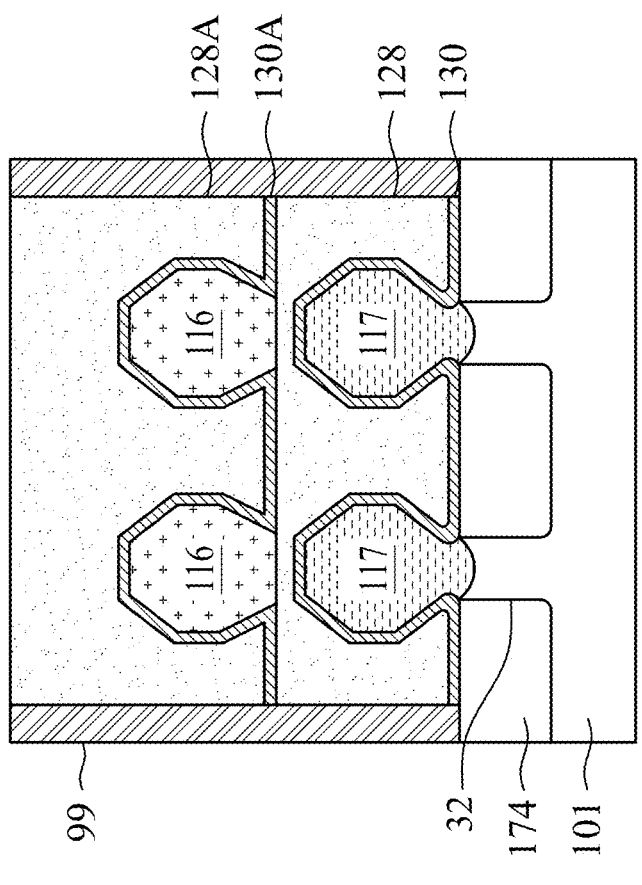
Figure 17C:
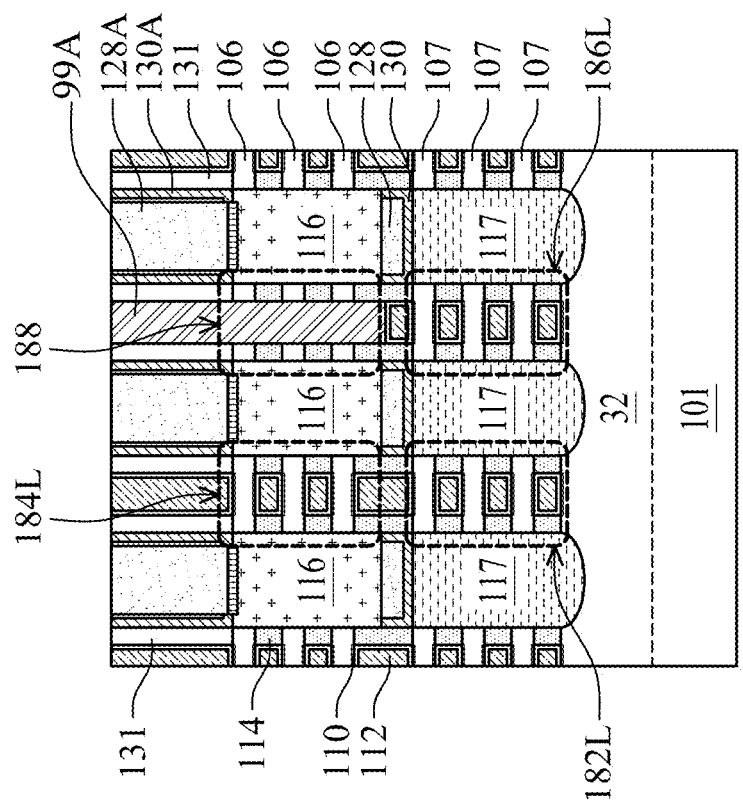

Following recessing of the gate metal 112, the dielectric layer 99A is formed in the opening (act 1600). As shown in FIG. 17C, the dielectric layer 99A may abut remaining portions of the channels 106, inner spacers 114, sidewall spacers 131, and the gate metal 112 underlying the dummy transistor 188. The dielectric layer 99A may be or include the same material as that of the gate isolation structures 99. In some embodiments, the dielectric layer 99A is a different material than the gate isolation structures 99. The dielectric layer 99A may be deposited by a suitable deposition process, such as a PVD, CVD, ALD or the like.

Figure 18B:
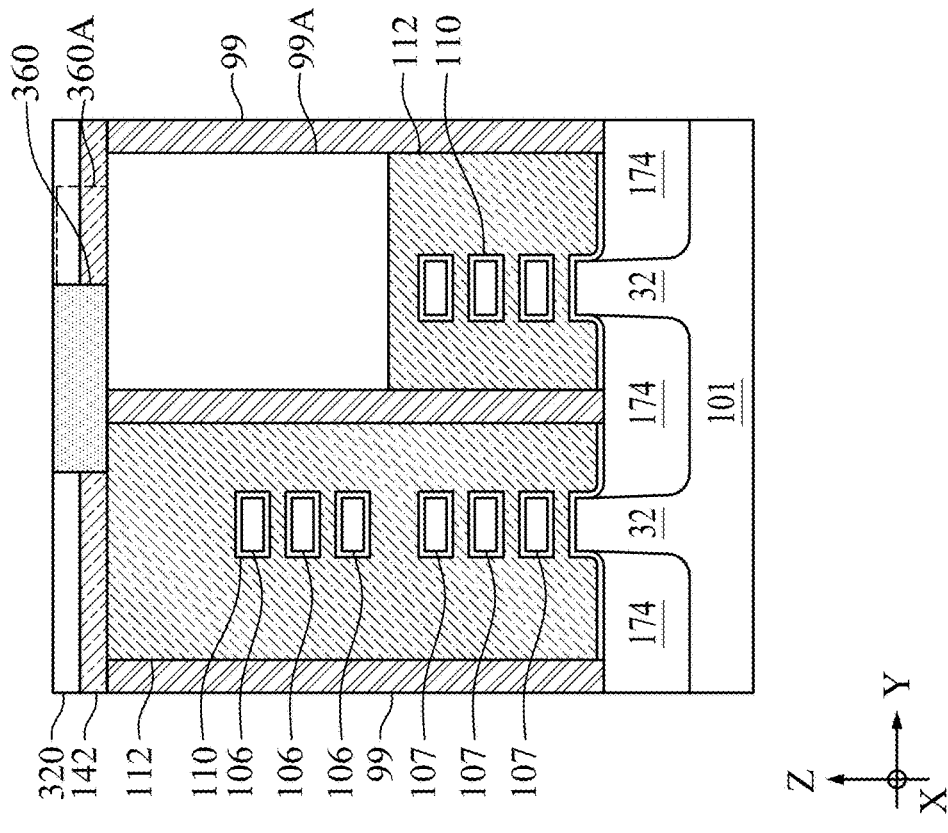
Figure 18A:
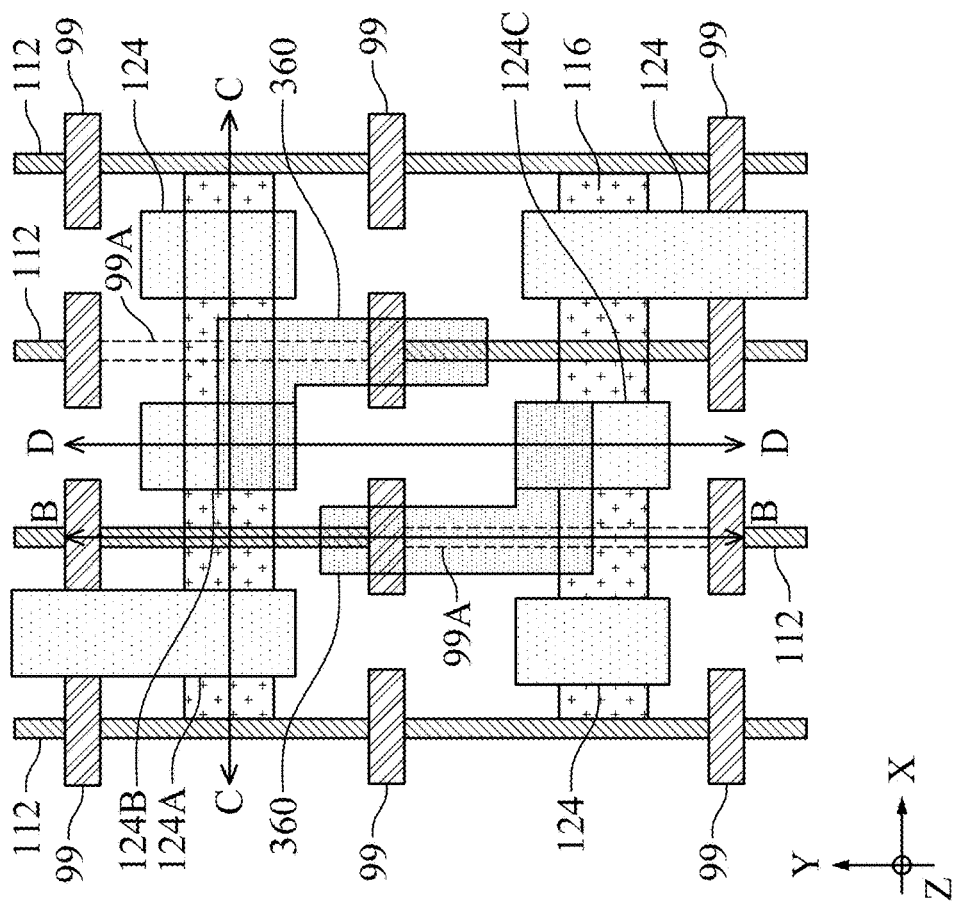
Figures 18C, 18D:
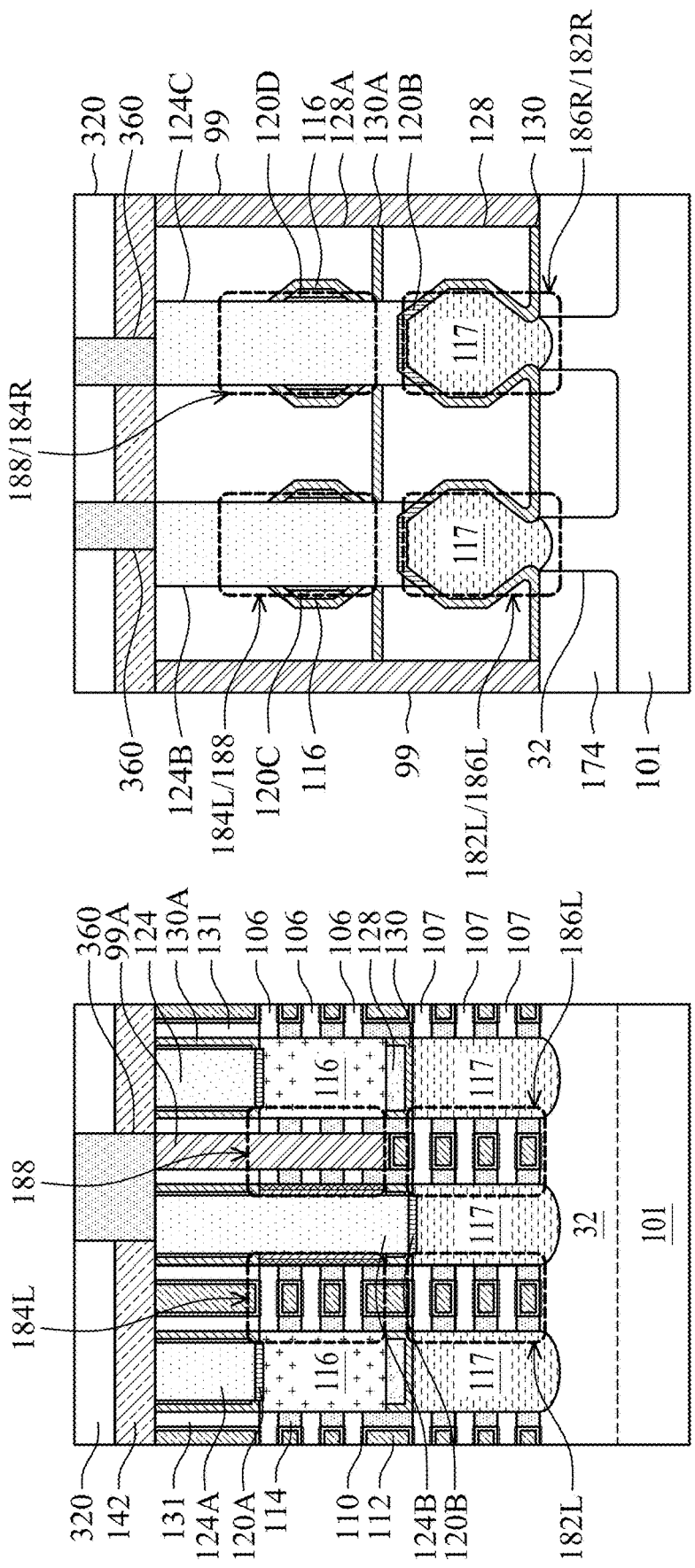

In FIGS. 18A-18D, L-shaped middle vias 360 are formed, corresponding to act 1700 of FIG. 24. Prior to forming the L-shaped middle vias 360, source/drain contacts 124 are formed as described with reference to FIGS. 12A-12D. As shown in FIG. 18C, the source/drain contacts 124 may include a source contact 124A that contacts a source 116 of the pull-down transistor 184L. The source/drain contacts 124 may include a drain contact 124B that contacts drains 116 of the pull-up transistor 182L, the pull-down transistor 184L and the pass gate transistor 186L. The source/drain contacts 124 may include a drain contact 124C (see FIG. 18D) that contacts drains 116 of the pull-up transistor 182R, the pull-down transistor 184R and the pass gate transistor 186R.

Following formation of the source/drain contacts 124, the L-shaped middle vias 360 are formed. The CESL 142 and the ILD 320 may be formed as described with reference to FIGS. 13A-13D. Then, the ILD 320 and the CESL 142 may be patterned to form openings in which the L-shaped middle vias 360 are formed in a subsequent operation. The L-shaped middle vias 360 are then formed in the openings. In some embodiments, the L-shaped middle vias 360 are formed in the same manner using the same materials and processes described with reference to FIGS. 13A-13D. A material of the L-shaped middle vias 360, such as W, Co, Mo, Ru, Cu, Al, or the like, may be deposited in the openings by a suitable deposition operation, such as a PVD, CVD or ALD. Then, excess material of the L-shaped middle vias 360 overlying the ILD 320 may be removed by a planarization operation, such as a CMP.

As shown in FIG. 18A, each of the middle vias 360 may have a first portion that extends in a first direction, such as the Y-axis direction. Each of the middle vias 360 may have a second portion that extends in a second direction, such as the X-axis direction. The second portion may be wider in the X-axis direction than the first portion. The first portion may overlap the gate metal 112 of the transistors 182L, 184L (or of the transistors 182R, 184R), the gate isolation structure 99 and the dielectric layer 99A. In some embodiments, the first portion extends past the second portion, as shown in FIG. 18B in phantom and labeled 360A. The second portion extends to contact the drain contact 124C (or the drain contact 124B), as shown in FIGS. 18A, 18C and 18D. Disposing the middle vias 360 to overlap the dielectric layer 99A allows for cell height reduction by relaxing gate isolation structure overlay window and drain isolation/separation overlay window.

In FIGS. 19A-19D, frontside and backside routing are formed, which are described with reference to FIGS. 14A-14D and 15A-15D, respectively. As shown in FIG. 19C, a first backside via 460 is disposed to couple a lower source region 117 to the bitline 192L that carries the signal BL, and a second backside via 460A is disposed to couple another lower source region 117 to a power supply node that supplies the first voltage level VDD. The source via 124A couples the upper source region 116 to a power supply node that supplies the second voltage level VSS.

In the device shown in FIGS. 19A-19D, the transistors that include the lower source/drain regions 117 are P-type transistors, and the transistors that include the upper source/drain regions 116 are N-type transistors. In some embodiments, the transistors that include the lower source/drain regions 117 are N-type transistors, and the transistors that include the upper source/drain regions 116 are P-type transistors. In such embodiments, the pass gate transistors 186L, 186R that underlie the dielectric layers 99A may be N-type transistors. Gate electrodes 112 of the pass gate transistors 186L, 186R are coupled to a word line by backside gate vias 470.

Figure 20B:
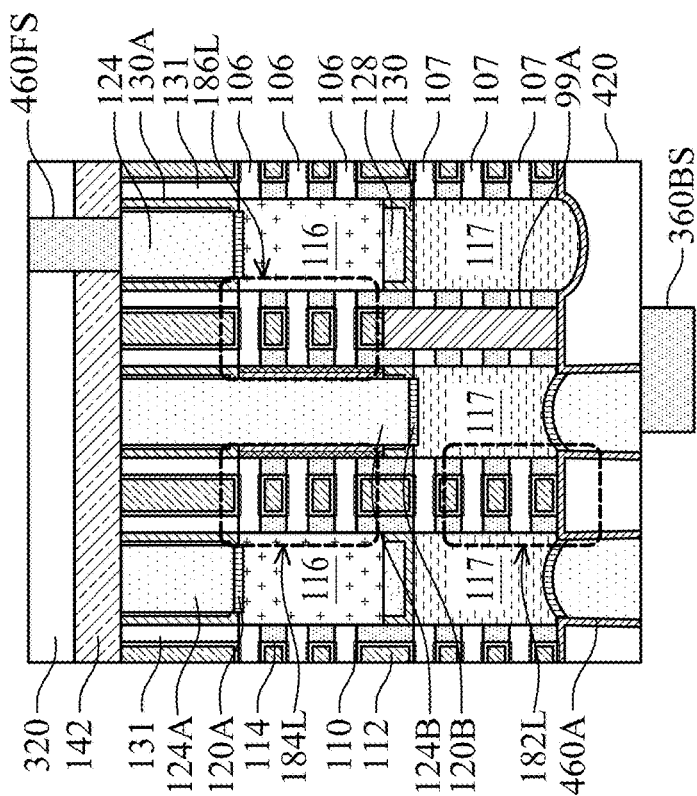
FIGS. 20A and 20B are diagrammatic cross-sectional side views of an IC device in accordance with various embodiments.
Figure 20A:
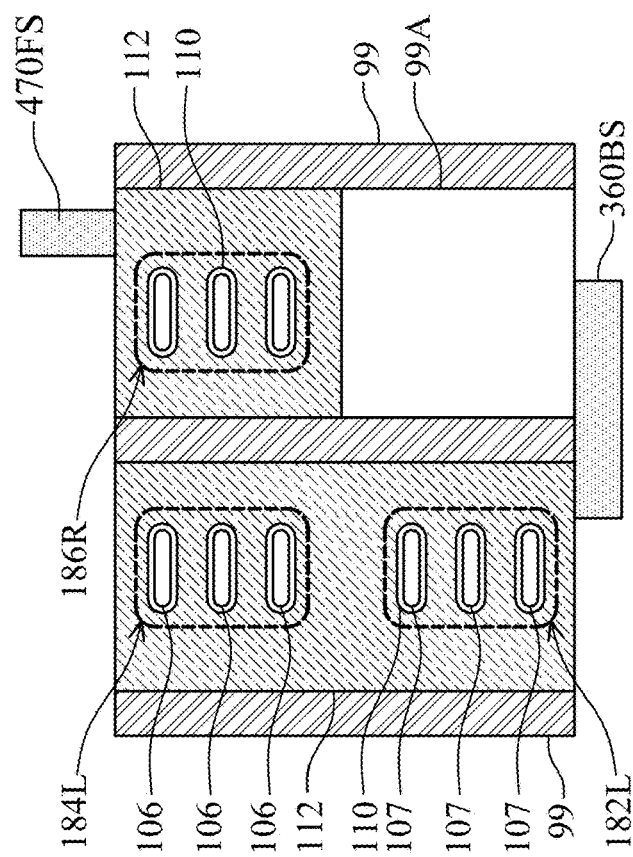

FIGS. 20A, 20B illustrate an embodiment in which the pass gate transistors 186L, 186R are above the dielectric layers 99A, and are connected to upper source/drain regions 116. Some components (e.g., the ILD 320) are omitted from view in one or both of FIGS. 20A, 20B for simplicity of illustration. In such embodiments, the L-shaped middle vias 360 are disposed on the backside of the IC device 100, as shown by the L-shaped middle via 360BS in FIG. 20A. Gate electrodes 112 of the pass gate transistors 186L, 186R are coupled to the word line by frontside gate vias 470FS.

In the embodiment shown in FIGS. 20A, 20B, the dielectric layers 99A may be formed using a process that is different from that described previously. Namely, following formation of frontside source/drain contacts 124 and the frontside interconnect structure 400, the IC device may be flipped, and the substrate 101 may be removed as described previously with reference to FIGS. 15A-15D. Following removal of the substrate 101, the isolation regions 174 and the fins 32 corresponding to the gate metal 112 to be removed are removed, such that the gate metal 112 is exposed. The gate metal 112 and nanostructures 107 are removed fully or partially by suitable etching processes, leaving an opening in which the dielectric layer 99A is deposited. In such embodiments, the dielectric layer 99A may contact the channels 107, the inner spacers 114 and the bottom of the gate metal 112 of the pass gate transistor 186L (or 186R), as shown in FIG. 20B. Following formation of the dielectric layers 99A, the L-shaped middle vias 360BS may be formed in a backside process that is similar to that described with reference to FIGS. 15A-15D. Namely, after forming backside source/drain contacts 460 (or 460A) in the backside ILD 420, the backside L-shaped middle vias 360BS may be formed by patterning a second backside ILD on the backside ILD 420 to form openings, and depositing conductive material of the backside L-shaped middle vias 360BS in the openings.

In some embodiments, the pass gate transistors 186L, 186R shown in FIG. 20A are N-type transistors or P-type transistors. In FIG. 20A, the pass gate transistors 186L, 186R are the same type as the pull-down transistors 184L, 184R. In FIG. 19A, the pass gate transistors 186L, 186R are the same type as the pull-up transistors 182L, 182R.

Figures 21A, 21B, 21C:
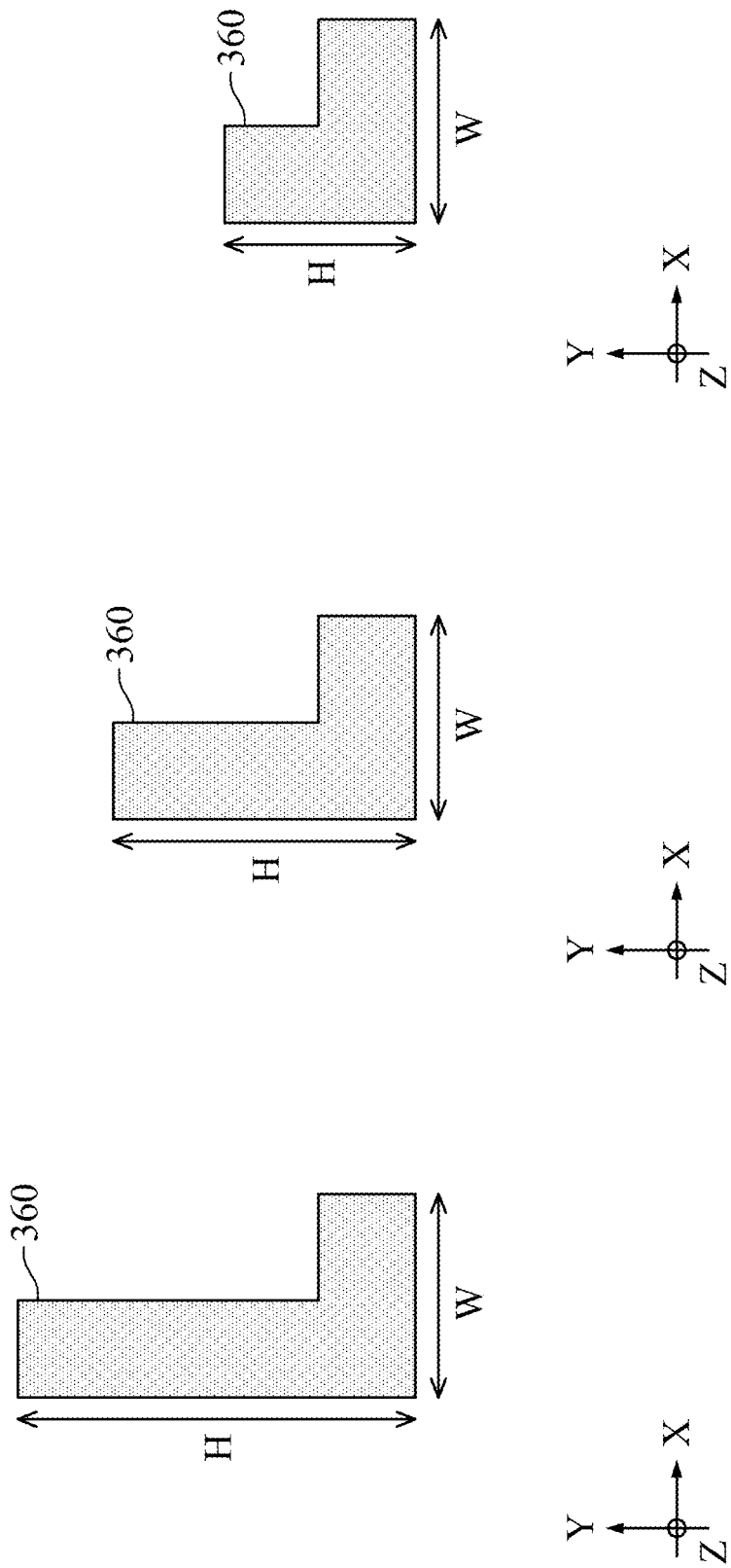
FIGS. 21A-21C are diagrammatic plan views of a middle via in accordance with various embodiments.

FIGS. 21A-21C are plan views of the L-shaped middle vias 360 in accordance with various embodiments. In some embodiments, the L-shaped middle vias 360 have height H and width W, as shown. The width W may be in a range of about 20 nm to about 80 nm. A ratio of height H over width W may be about 2 (FIG. 21A), about 1.5 (FIG. 21B) or 1 (FIG. 21C). Other ratios of height H over width W that fall between the ratios just mentioned are also contemplated embodiments, herein. For example, the ratio may be 1.2, 1.7 or another suitable ratio.

Figure 22:
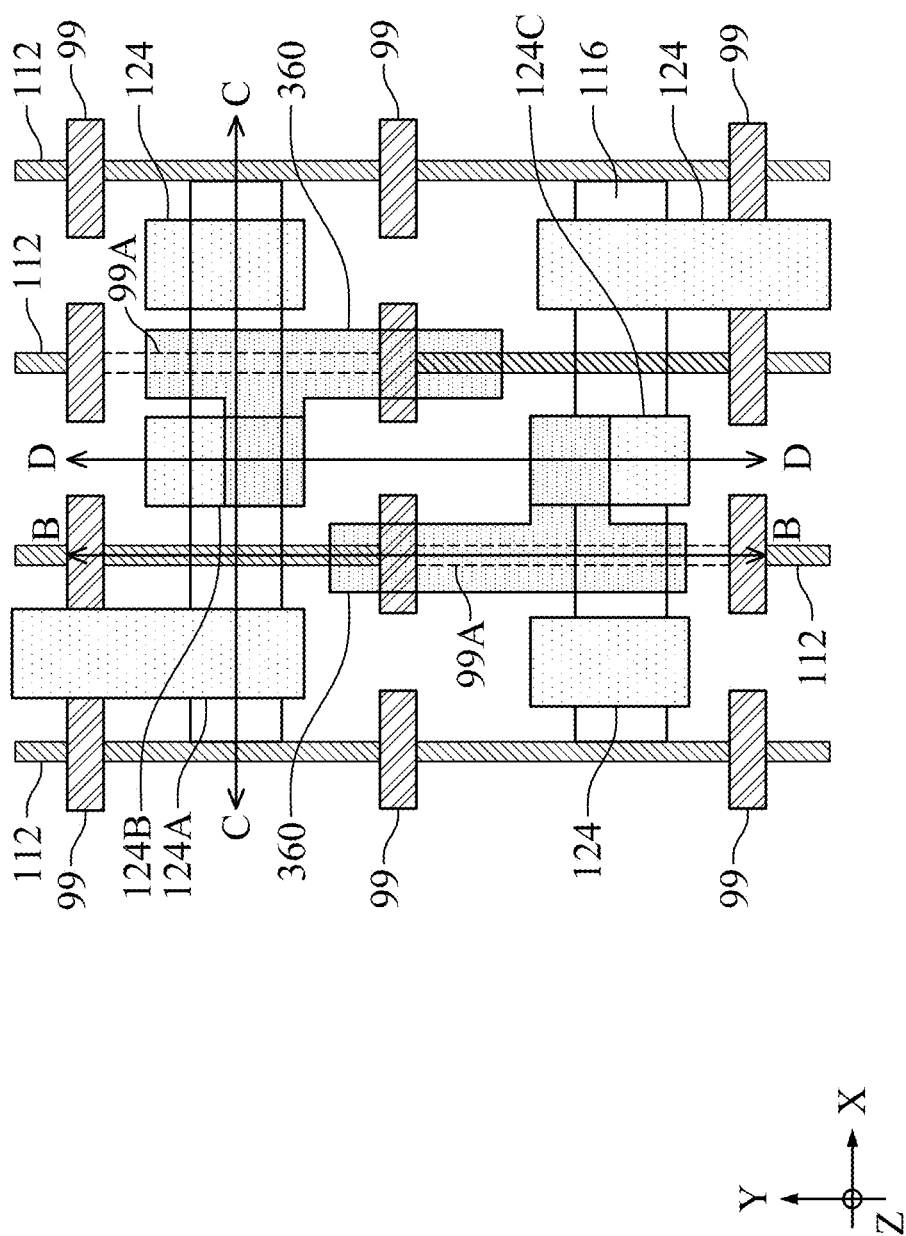
FIG. 22 is a diagrammatic plan view of an IC device in accordance with various embodiments.
Figure 23A:
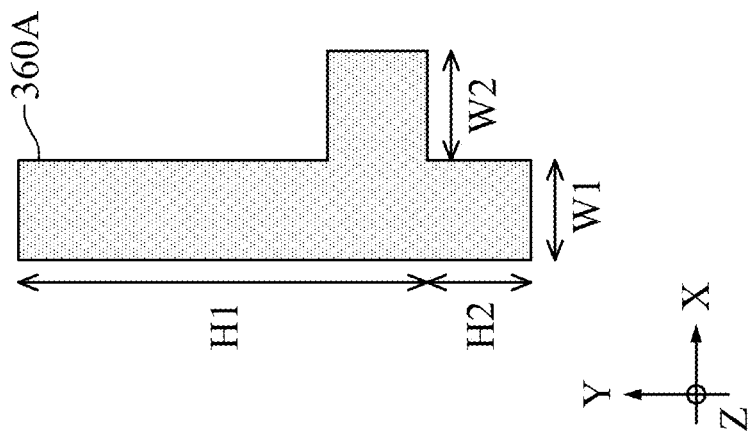
FIGS. 23A-23C are diagrammatic plan views of a middle via in accordance with various embodiments.
Figure 23B:
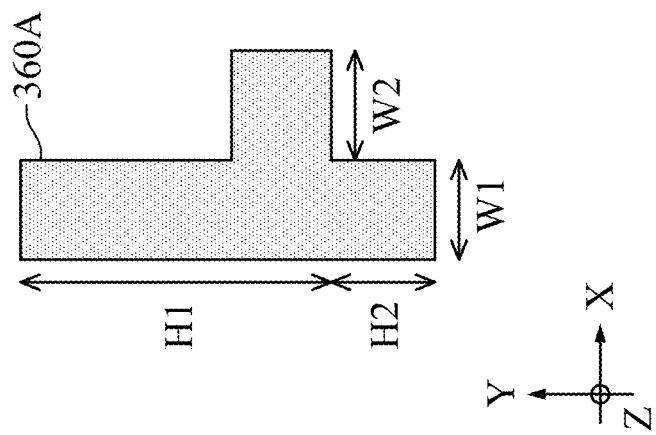
Figure 23C:
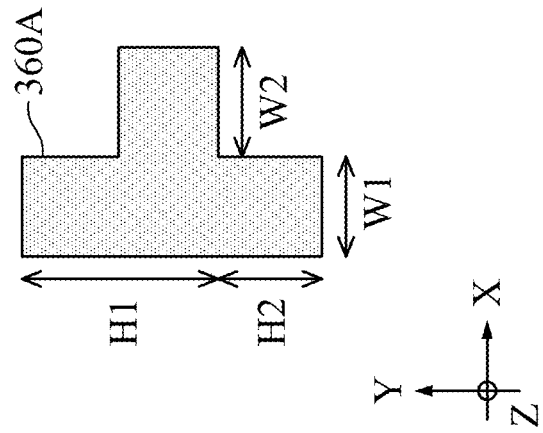

FIGS. 22 and 23A-23C illustrate the L-shaped middle vias 360 in accordance with various other embodiments. In FIG. 22, the L-shaped middle vias 360 have first portions that extend beyond the second portions, as described above with reference to FIGS. 18A-18D. As shown in FIGS. 23A-23C, an extension portion of the middle vias 360 may have height H2 and width W1. Height H1 may be the same dimension as height H shown in FIGS. 21A-21C. Width W1+W2 may be the same dimension as the width W shown in FIGS. 21A-21C. In some embodiments, height H2 of the extension portion may be in a range of about 10 nm to about 40 nm. The shape of the middle vias 360 may also be referred to as T shape, and the middle vias 360 of FIGS. 23A-23C may be referred to as T-shaped middle vias 360A. Referring again to FIG. 18B, the extension portion of the T-shaped middle via 360A is shown in phantom. In such embodiments, the first portion of the T-shaped middle via 360A that extends in the Y-axis direction may extend past the nanostructures 107, as shown in FIG. 18B.

Embodiments may provide advantages. The L-shaped or T-shaped middle vias 360, 360A reduce cell area by relaxing gate isolation structure overlay window and source/drain region isolation overlay window.

In accordance with at least one embodiment, a device includes: a first stack of first semiconductor nanostructures; a second stack of second semiconductor nanostructures on the first stack of semiconductor nanostructures; a third stack of first semiconductor nanostructures adjacent the first stack; a first gate structure wrapping around the first stack and the second stack; a second gate structure wrapping around the third stack; a gate isolation structure between the first gate structure and the second gate structure; a dielectric layer on the second gate structure and laterally abutting the gate isolation structure; and a via. The via includes: a first portion that extends in a first direction, the first portion being on the first gate structure, the gate isolation structure and the dielectric layer; and a second portion that extends in a second direction transverse the first direction.

In accordance with at least one embodiment, a method includes forming a first vertical stack of nanostructure channels, a second vertical stack of nanostructure channels, a third vertical stack of nanostructure channels and a fourth vertical stack of nanostructure channels over a substrate, the second vertical stack being on the first vertical stack, the fourth vertical stack being on the third vertical stack; forming a first source/drain region abutting the nanostructure channels of the first vertical stack, and forming a second source/drain region abutting the nanostructure channels of the second vertical stack; forming a gate structure that wraps around the nanostructure channels of the first, second, third and fourth vertical stacks; forming a first gate structure and a second gate structure by forming a gate isolation structure that extends through the gate structure; forming an opening by removing a portion of the second gate structure; forming a dielectric layer in the opening; and forming a via on the first gate structure and the dielectric layer.

In accordance with at least one embodiment, a memory circuit includes: a first pull-up transistor having a first stack of nanostructure channels; and a first pull-down transistor. The first pull-down transistor includes: a second stack of nanostructure channels on the first stack; and a drain electrode coupled to a drain electrode of the first pull-up transistor. The memory circuit further includes: a second pull-up transistor having a gate electrode; a first pass gate transistor including: a third stack of nanostructure channels laterally separated from the first and second stacks; a gate electrode; and a drain electrode coupled to the drain electrodes of the first pull-up transistor and the first pull-down transistor; and a via. The via includes: a first portion that extends in a first direction, the first portion being on the gate electrode; and a second portion that extends in a second direction transverse the first direction, the second portion being on the drain electrodes of the first pull-up transistor, the first pull-down transistor and the first pass gate transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a first stack of first semiconductor nanostructures;
a second stack of second semiconductor nanostructures on the first stack of semiconductor nanostructures;
a third stack of first semiconductor nanostructures adjacent the first stack;
a first gate structure wrapping around the first stack and the second stack;
a second gate structure wrapping around the third stack;
a gate isolation structure between the first gate structure and the second gate structure;
a dielectric layer on the second gate structure and laterally abutting the gate isolation structure; and
a via that includes:
a first portion that extends in a first direction, the first portion being on the first gate structure, the gate isolation structure and the dielectric layer; and
a second portion that extends in a second direction transverse the first direction.

2. The device of claim 1, wherein the first portion partially overlaps the third stack along the first direction.

3. The device of claim 1, wherein the first portion extends past the third stack along the first direction.

4. The device of claim 1, wherein the via is electrically connected to a drain region of a first pull-up transistor and to a gate electrode of a second pull-up transistor, the gate electrode including the first gate structure.

5. The device of claim 4, wherein the first portion overlaps the gate electrode, and the second portion overlaps the drain region.

6. The device of claim 1, wherein the via has height in the first direction and width in the second direction, and a ratio of the height to the width is in a range of about 1 to about 2.

7. The device of claim 1, further comprising:
a first source/drain region adjacent the first stack of nanostructures;
a second source/drain region adjacent the second stack of nanostructure;
a third source/drain region adjacent the third stack of nanostructures;
a first source/drain contact on the second source/drain region; and
a second source/drain contact under the first source/drain region.

8. The device of claim 7, further comprising:
a fourth source/drain region adjacent the dielectric layer; and
a third source/drain contact on the third source/drain region, the third source/drain contact extending through the fourth source/drain region.

9. A method, comprising:
forming a first vertical stack of nanostructure channels, a second vertical stack of nanostructure channels, a third vertical stack of nanostructure channels and a fourth vertical stack of nanostructure channels over a substrate, the second vertical stack being on the first vertical stack, the fourth vertical stack being on the third vertical stack;
forming a first source/drain region abutting the nanostructure channels of the first vertical stack, and forming a second source/drain region abutting the nanostructure channels of the second vertical stack;
forming a gate structure that wraps around the nanostructure channels of the first, second, third and fourth vertical stacks;
forming a first gate structure and a second gate structure by forming a gate isolation structure that extends through the gate structure;
forming an opening by removing a portion of the second gate structure;
forming a dielectric layer in the opening; and
forming a via on the first gate structure and the dielectric layer.

10. The method of claim 9, further comprising:
forming a source/drain contact on the second source/drain region.

11. The method of claim 10, wherein the opening is formed after the forming a source/drain contact.

12. The method of claim 9, further comprising:
exposing an underside of the second gate structure by removing the substrate; and
forming the opening by etching the underside of the second gate structure.

13. The method of claim 9, wherein the via includes:
a first portion that extends in a first direction, the first portion being on the first gate structure, the gate isolation structure and the dielectric layer; and
a second portion that extends in a second direction transverse the first direction.

14. A memory circuit, comprising:
a first pull-up transistor having a first stack of nanostructure channels;
a first pull-down transistor including:
a second stack of nanostructure channels on the first stack; and
a drain electrode coupled to a drain electrode of the first pull-up transistor;
a second pull-up transistor having a gate electrode;
a first pass gate transistor including:
a third stack of nanostructure channels laterally separated from the first and second stacks;
a gate electrode; and
a drain electrode coupled to the drain electrodes of the first pull-up transistor and the first pull-down transistor; and
a via that includes:
a first portion that extends in a first direction, the first portion being on the gate electrode; and
a second portion that extends in a second direction transverse the first direction, the second portion being on the drain electrodes of the first pull-up transistor, the first pull-down transistor and the first pass gate transistor.

15. The memory circuit of claim 14, further comprising:
a second pull-down transistor having a gate electrode coupled to the gate electrode of the second pull-up transistor; and
a second pass gate transistor having a drain electrode coupled to drain electrodes of the second pull-up transistor and the second pull-down transistor.

16. The memory circuit of claim 15, further comprising a second via, the second via including:
a third portion that extends in the first direction, the third portion being on gate electrodes of the first pull-up transistor and the first pull-down transistor; and
a fourth portion that extends in the second direction transverse the first direction, the second portion being on the drain electrodes of the second pull-up transistor, the second pull-down transistor and the second pass gate transistor.

17. The memory circuit of claim 16, wherein the via and the second via are disposed on a backside of the memory circuit.

18. The memory circuit of claim 15, further comprising:
a dielectric layer on the third stack.

19. The memory circuit of claim 18, wherein the dielectric layer extends vertically from the gate electrode of the first pass gate transistor to a bottom side of the via.

20. The memory circuit of claim 14, further comprising:
a backside via that is electrically connected to the gate electrode of the first pass gate transistor and to a word line.

* * * * *